US012288779B2

(12) United States Patent
Takahashi et al.

(10) Patent No.: US 12,288,779 B2
(45) Date of Patent: Apr. 29, 2025

(54) SEMICONDUCTOR DEVICE AND MANUFACTURING METHOD THEREOF

(71) Applicant: SEMICONDUCTOR ENERGY LABORATORY CO., LTD., Atsugi (JP)

(72) Inventors: Kei Takahashi, Kanagawa (JP); Koji Kusunoki, Kanagawa (JP); Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 95 days.

(21) Appl. No.: 17/613,189

(22) PCT Filed: Aug. 20, 2020

(86) PCT No.: PCT/IB2020/057818
§ 371 (c)(1),
(2) Date: Nov. 22, 2021

(87) PCT Pub. No.: WO2021/038392
PCT Pub. Date: Mar. 4, 2021

(65) Prior Publication Data
US 2022/0320064 A1    Oct. 6, 2022

(30) Foreign Application Priority Data

Aug. 27, 2019   (JP) .................. 2019-154234

(51) Int. Cl.
*H01L 25/18*     (2023.01)
*G06F 3/041*     (2006.01)
(Continued)

(52) U.S. Cl.
CPC ............ *H01L 25/18* (2013.01); *G06F 3/0412* (2013.01); *G06F 3/0421* (2013.01); *G06F 3/044* (2013.01);
(Continued)

(58) Field of Classification Search
None
See application file for complete search history.

(56) References Cited

U.S. PATENT DOCUMENTS

| 8,243,027 B2 | 8/2012 | Hotelling et al. |
| 8,259,078 B2 | 9/2012 | Hotelling et al. |

(Continued)

FOREIGN PATENT DOCUMENTS

| CN | 101241922 A | 8/2008 |
| CN | 101467119 A | 6/2009 |

(Continued)

OTHER PUBLICATIONS

International Search Report (Application No. PCT/IB2020/057818) dated Dec. 15, 2020.
(Continued)

*Primary Examiner* — Christopher R Lamb
(74) *Attorney, Agent, or Firm* — Fish & Richardson P.C.

(57) ABSTRACT

To achieve multifunctionality, a large number of components and the time and effort for implementing the components are required, which leads to an increase in the manufacturing cost and a reduction in yield. A matrix display portion and a matrix optical sensor portion are formed over one substrate. In addition, a driver circuit of the display portion and a driver circuit of the optical sensor portion formed over the same substrate as that for the display portion are built in one chip, whereby the number of components can be reduced. When the optical sensor is formed in a display panel, a barcode reader function or a scanner function can be given to the display panel. Furthermore, a function of authenticating fingerprints or the like or an input/output function of a touch sensor can be given to the display panel.

18 Claims, 22 Drawing Sheets

(51) Int. Cl.
*G06F 3/042* (2006.01)
*G06F 3/044* (2006.01)
*H10K 65/00* (2023.01)
(52) U.S. Cl.
CPC ... *H10K 65/00* (2023.02); *G06F 2203/04106* (2013.01)

(56) References Cited

U.S. PATENT DOCUMENTS

| | | | |
|---|---|---|---|
| 8,432,371 | B2 | 4/2013 | Hotelling et al. |
| 8,451,244 | B2 | 5/2013 | Hotelling et al. |
| 8,552,989 | B2 | 10/2013 | Hotelling et al. |
| 8,654,083 | B2 | 2/2014 | Hotelling et al. |
| 9,236,408 | B2 | 1/2016 | Yamazaki |
| 9,244,561 | B2 | 1/2016 | Hotelling et al. |
| 9,268,429 | B2 | 2/2016 | Hotelling et al. |
| 9,425,226 | B2 | 8/2016 | Yamazaki et al. |
| 9,575,610 | B2 | 2/2017 | Hotelling et al. |
| 9,971,440 | B2 | 5/2018 | Kurokawa et al. |
| 10,191,576 | B2 | 1/2019 | Hotelling et al. |
| 10,268,326 | B2 | 4/2019 | Kobayashi |
| 10,296,157 | B2 | 5/2019 | Takahashi et al. |
| 10,921,855 | B1* | 2/2021 | Wen ............... G09G 3/3275 |
| 10,976,846 | B2 | 4/2021 | Hotelling et al. |
| 11,175,762 | B2 | 11/2021 | Hotelling et al. |
| 2008/0062139 | A1 | 3/2008 | Hotelling et al. |
| 2008/0062140 | A1 | 3/2008 | Hotelling et al. |
| 2008/0062147 | A1 | 3/2008 | Hotelling et al. |
| 2008/0062148 | A1 | 3/2008 | Hotelling et al. |
| 2008/0211781 | A1 | 9/2008 | Yamamoto |
| 2011/0037729 | A1* | 2/2011 | Cho ..................... G06F 3/0412 438/34 |
| 2011/0169759 | A1 | 7/2011 | Wang et al. |
| 2013/0075761 | A1* | 3/2013 | Akiyama ............. H10K 65/00 257/E31.095 |
| 2013/0288426 | A1* | 10/2013 | Akimoto ........... H01L 29/66765 438/104 |
| 2013/0300952 | A1 | 11/2013 | Yeh et al. |
| 2014/0354575 | A1 | 12/2014 | Wang et al. |
| 2015/0249119 | A1* | 9/2015 | In ..................... H10K 50/818 257/40 |
| 2015/0279884 | A1 | 10/2015 | Kusumoto |
| 2016/0092027 | A1 | 3/2016 | Lee et al. |
| 2016/0116779 | A1 | 4/2016 | Yeh et al. |
| 2016/0351552 | A1 | 12/2016 | Takahashi et al. |
| 2016/0370898 | A1 | 12/2016 | Kobayashi |
| 2017/0154199 | A1* | 6/2017 | Li ....................... G02F 1/13338 |
| 2018/0076256 | A1 | 3/2018 | Jiang et al. |
| 2018/0315373 | A1 | 11/2018 | Wang et al. |

FOREIGN PATENT DOCUMENTS

| | | |
|---|---|---|
| CN | 101467120 A | 6/2009 |
| CN | 102749747 A | 10/2012 |
| CN | 105892773 A | 8/2016 |
| CN | 106970495 A | 7/2017 |
| DE | 112007003360 | 2/2010 |
| DE | 112007002544 | 7/2010 |
| EP | 2027524 A | 2/2009 |
| EP | 2259172 A | 12/2010 |
| EP | 2330491 A | 6/2011 |
| EP | 2330492 A | 6/2011 |
| EP | 2330493 A | 6/2011 |
| EP | 2330494 A | 6/2011 |
| EP | 3264240 A | 1/2018 |
| EP | 3352221 A | 7/2018 |
| EP | 3805907 A | 4/2021 |
| GB | 2451210 | 1/2009 |
| GB | 2455179 | 6/2009 |
| GB | 2455208 | 6/2009 |
| JP | 2008-198646 A | 8/2008 |
| JP | 2009-199093 A | 9/2009 |
| JP | 2009-211706 A | 9/2009 |
| JP | 2009-540374 | 11/2009 |
| JP | 2017-010017 A | 1/2017 |
| JP | 2017-016098 A | 1/2017 |
| JP | 2018-533749 | 11/2018 |
| KR | 2008-0074764 A | 8/2008 |
| KR | 2009-0019902 A | 2/2009 |
| KR | 2009-0028627 A | 3/2009 |
| KR | 2016-0037381 A | 4/2016 |
| KR | 2018-0125170 A | 11/2018 |
| TW | 200846992 | 12/2008 |
| TW | 201124961 | 7/2011 |
| TW | 201346666 | 11/2013 |
| TW | 201712521 | 4/2017 |
| WO | WO-2007/146779 | 12/2007 |
| WO | WO-2007/146780 | 12/2007 |
| WO | WO-2007/146783 | 12/2007 |
| WO | WO-2007/146785 | 12/2007 |
| WO | WO-2018/049745 | 3/2018 |

OTHER PUBLICATIONS

Written Opinion (Application No. PCT/IB2020/057818) dated Dec. 15, 2020.

* cited by examiner

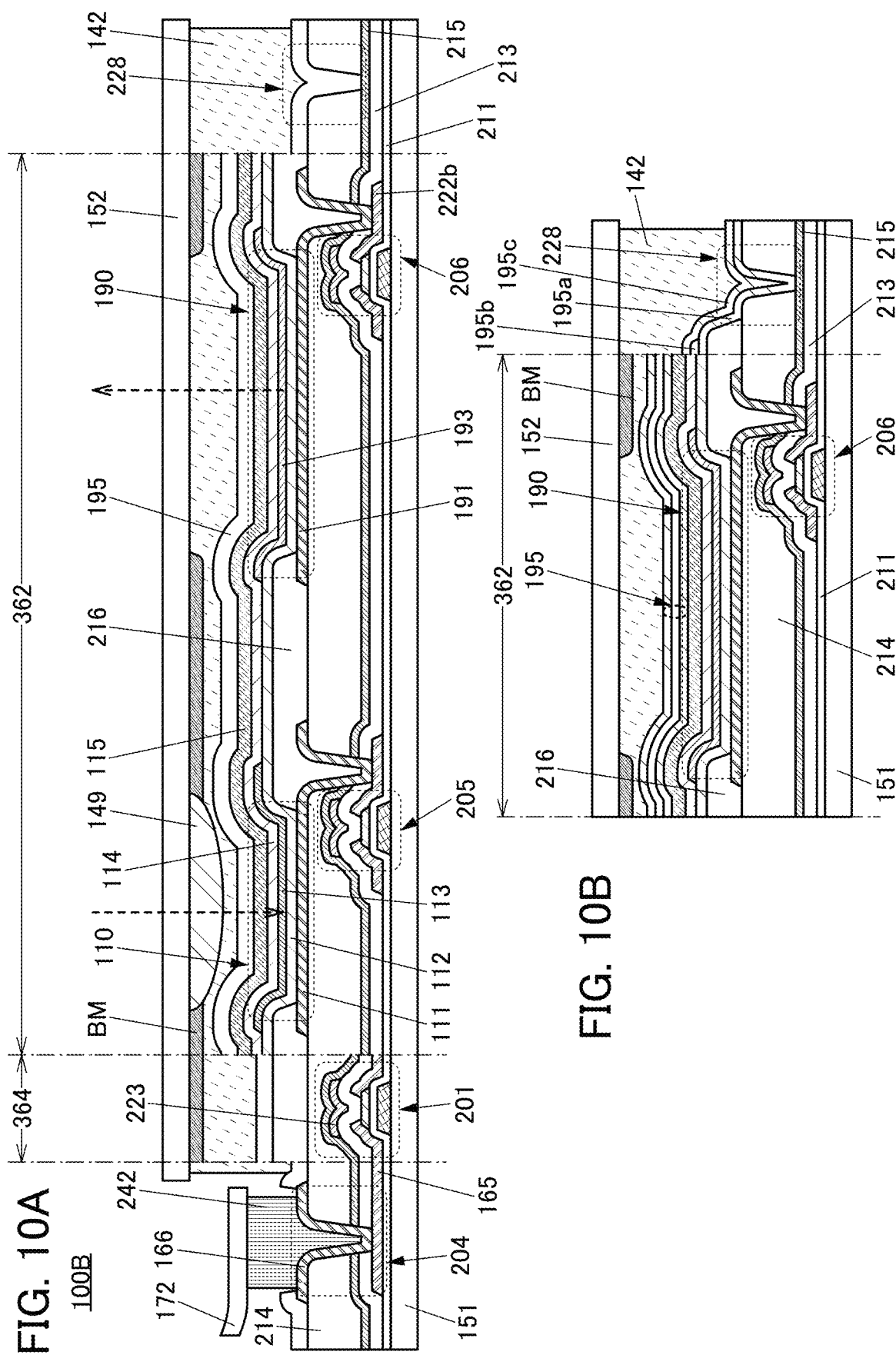

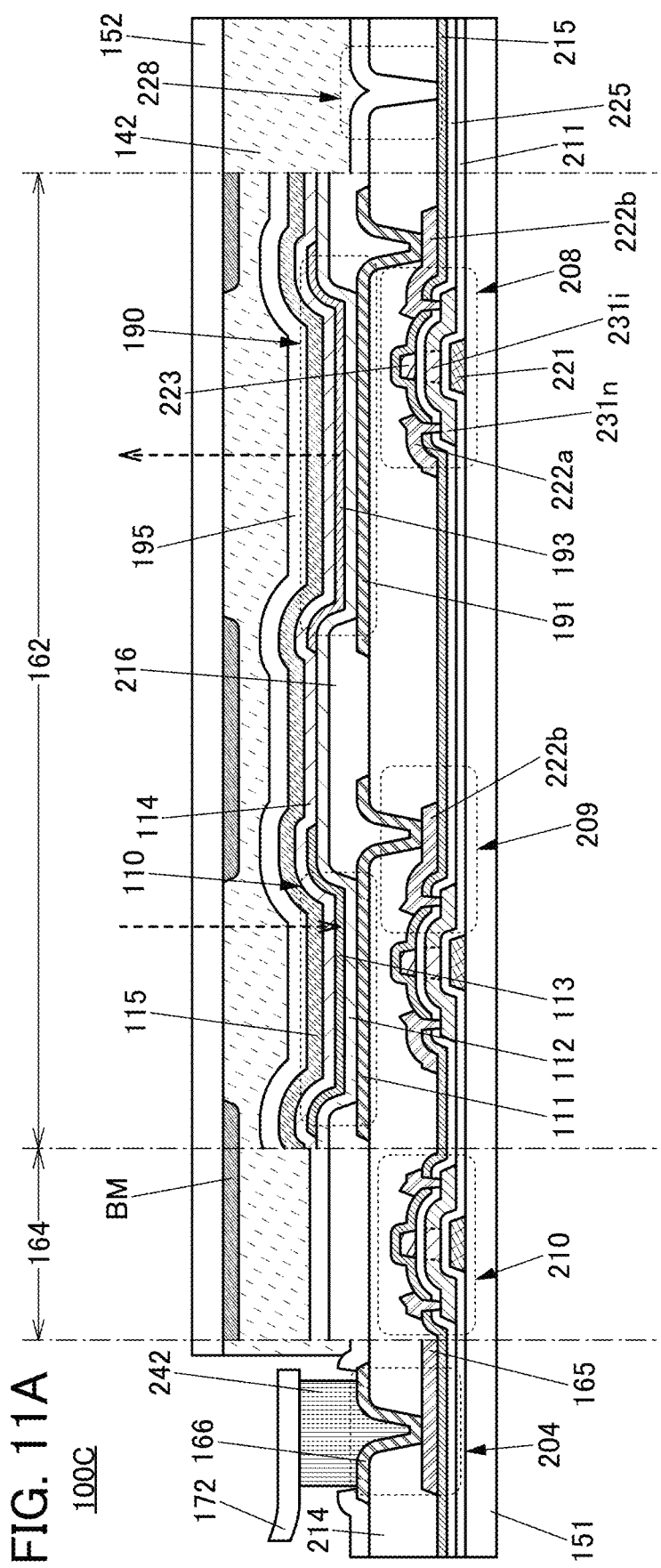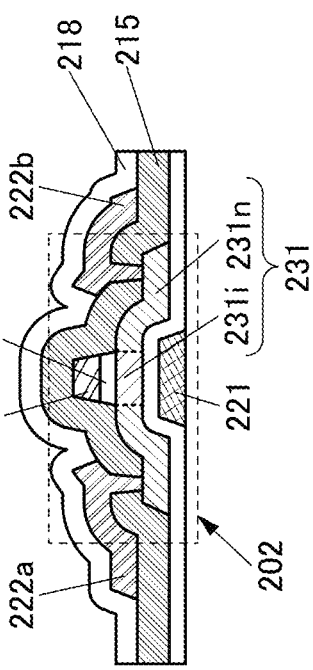

FIG. 19A
| Amorphous | Intermediate state<br>New crystalline phase<br>Crystalline | Crystal |
|---|---|---|
| •completely<br>amorphous | •CAAC<br>•nc<br>•CAC<br>excluding<br>single crystal<br>and poly crystal | •single crystal<br>•poly crystal |
FIG. 19B
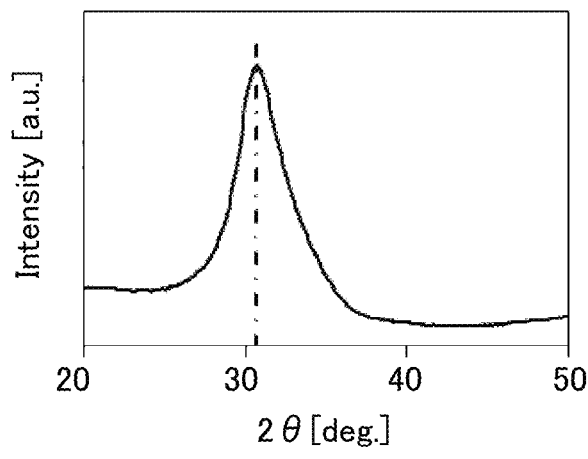
FIG. 19C
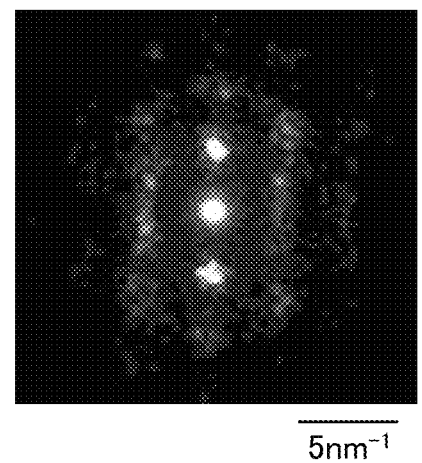

SEMICONDUCTOR DEVICE AND MANUFACTURING METHOD THEREOF

CROSS REFERENCE TO RELATED APPLICATIONS

This application is a U.S. National Phase Application under 35 U.S.C. § 371 of International Application PCT/IB2020/057818, filed on Aug. 20, 2020, which is incorporated by reference and claims the benefit of a foreign priority application filed in Japan on Aug. 27, 2019, as Application No. 2019-154234.

TECHNICAL FIELD

One embodiment of the present invention relates to a display device with a touch sensor. Another embodiment of the present invention relates to a display device. Another embodiment of the present invention relates to a touch sensor. Another embodiment of the present invention relates to a semiconductor device.

Note that one embodiment of the present invention is not limited to the above technical field. One embodiment of the invention disclosed in this specification and the like relates to an object, a method, and a manufacturing method. One embodiment of the present invention relates to a process, a machine, manufacture, or a composition of matter. Therefore, specific examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an input device, an input/output device, an electro-optical device, a power generation device, (including a thin film solar cell, an organic thin film solar cell, and the like), and an electronic device may each include a semiconductor device.

BACKGROUND ART

In recent years, portable information terminals such as smartphones and tablet terminals have been widespread. For most of the portable information terminals, display devices provided with active matrix display portions, touch sensors, and the like are used.

Patent Document 1 discloses such a display device. In Patent Document 1, a technique by which a driver circuit for a display portion and a driver circuit for a touch sensor are formed in one IC.

REFERENCE

Patent Document

[Patent Document 1] Japanese Published Patent Application No. 2017-16098

SUMMARY OF THE INVENTION

Problems to be Solved by the Invention

An image displayed on a display panel is sometimes hard to see depending on the brightness in the outdoor or indoor surroundings of the display panel. A light-receiving element such as a photodiode is provided separately from the display panel to sense the brightness in the surroundings of the display panel for optimal display, so that an image displayed on the display panel is automatically adjusted in accordance with the amount of sensed light. In this case, the light-receiving element provided separately from the display panel brings the necessity of securing a space where the light-receiving element is provided in a device or the necessity of additionally mounting a chip including a semiconductor integrated circuit for light sensing. Moreover, in the case where the light-receiving element is provided separately, the light-receiving element to be used is a very small-sized element, whereby depending on its location, it is difficult to sense the amount of external light accurately.

Without limitation to the above-described light-receiving element, devices such as portable information terminals are required to have further multifunctionality in the future.

To achieve multifunctionality, it takes time and effort to connect a variety of accessories and the like to a device and install application software or the like for driving the accessories on the device. For example, although a barcode reader function, a scanner function, and the like can be achieved with use of the accessories, there are limitations on connection codes, applicable models, and the like, and thus the versatility is low.

Furthermore, in a device where a plurality of kinds of semiconductor integrated circuits, each of which constitutes one chip, are mounted, problems of an increase in the manufacturing cost or a reduction in yield arise because the number of components in the device is large and it takes time and effort to implement the components.

Means for Solving the Problems

In order to solve the above problems, a matrix display portion and a matrix optical sensor portion are formed over one substrate. In addition, a driver circuit of the display portion and a driver circuit of the optical sensor portion formed over the same substrate as that for the display portion are built in one chip, so that the number of components is reduced.

A structure of the invention disclosed in this specification is a semiconductor device including at least one chip including a semiconductor integrated circuit that is mounted on one of surfaces of a first substrate provided with a display portion and an optical sensor portion; and a second substrate overlapping with the display portion, where the first substrate and the second substrate are fixed so that the one of the surfaces of the first substrate and one of surfaces of the second substrate face each other, and where the chip including the semiconductor integrated circuit includes a driver circuit of the optical sensor portion and a driver circuit of the display portion.

An optical sensor is built in a display panel, whereby a barcode reader function or a scanner function can be given to the display panel. In addition, a function of authenticating fingerprints or the like, a function of obtaining biological data on a vein or the like, or an input function of a touch sensor can be given to the display panel.

When light-emitting elements using a layer containing an organic compound are used for displaying an image of the display panel, image data can be captured with use of reflected light of light emitted by the light-emitting elements. Thus, a QR code (registered trademark) or the like can be read out even in a dark place such as an outdoor place at night. In the dark place, it is difficult to read out the QR code (registered trademark) or the like with use of a camera, and therefore, the structure of this invention is effective.

Furthermore, a plurality of optical sensors are arranged in substantially the same region as that provided with the display panel; thus, with use of a large area, the amount of external light can be accurately sensed.

The optical sensor portion is provided in substantially the same region as that provided with the display panel and can be made to function as a touch panel when detecting a shadow of a finger of a person who touches the display panel, or the like.

When the display panel is used outdoors during the daytime, the optical sensor portion receives the sunlight, which makes it difficult for the display panel to function as a touch panel. Hence, a capacitive touch panel may be provided over the display panel, so that the display panel is switched to a capacitive touch panel depending on the amount of external light when being used outdoors during the daytime.

Another structure of the present invention is a structure including a touch panel portion. The structure is a semiconductor device including at least one chip including a semiconductor integrated circuit that is mounted on one of surfaces of a first substrate provided with a display portion and an optical sensor portion; and a touch panel portion on one of surfaces of a second substrate overlapping with the display portion, where the first substrate and the second substrate are fixed so that the one of the surfaces of the first substrate and the one of the surfaces of the second substrate face each other, and where the chip including the semiconductor integrated circuit includes a driver circuit of the display portion, a driver circuit of the optical sensor portion, and a driver circuit of the touch panel portion.

Although the above structure shows that one chip includes three kinds of driver circuits, the structure of the present invention is not particularly limited, and a structure in which one chip includes two kinds of driver circuits may be employed.

Another structure of the present invention is a structure including two kinds of driver circuits that are a driver circuit of a display portion and a driver circuit of a touch panel portion. The structure is a semiconductor device including at least one chip including a semiconductor integrated circuit that is mounted on one of surfaces of a first substrate provided with a display portion and an optical sensor portion; and a touch panel portion on one of surfaces of a second substrate overlapping with the display portion, where the first substrate and the second substrate are fixed so that the one of the surfaces of the first substrate and the one of the surfaces of the second substrate face each other, and where the chip including the semiconductor integrated circuit includes a driver circuit of the display portion and a driver circuit of the touch panel portion.

Another structure of the present invention is a structure in which two kinds of driver circuits that are a driver circuit of an optical sensor portion and a driver circuit of a touch panel portion are included. The structure is a semiconductor device including at least one chip including a semiconductor integrated circuit that is mounted on one of surfaces of a first substrate provided with a display portion and an optical sensor portion; and a touch panel portion on one of surfaces of a second substrate overlapping with the display portion, where the first substrate and the second substrate are fixed so that the one of the surfaces of the first substrate and the one of the surfaces of the second substrate face each other, and where the chip including the semiconductor integrated circuit includes a driver circuit of the optical sensor portion and a driver circuit of the touch panel portion.

In the case where the first substrate is a glass substrate in the display panel, an IC (semiconductor integrated circuit) mounted by a COG (Chip On Glass) method is used as the driver circuit of the display portion.

In the case where a film, e.g., a plastic film, is used for the first substrate, an IC can be mounted by a packaging method such as a COF (Chip On Film) method or TCP (Tape Carrier Package).

Furthermore, an IC can be located over an FPC (Flexible printed circuits).

Another structure of the present invention is a structure in which an IC is located over an FPC. The structure is a semiconductor device including a first substrate provided with a display portion, an optical sensor portion, and a terminal portion; a film including a wiring electrically connected to the terminal portion; at least one chip including a semiconductor integrated circuit that is mounted on the film; and a second substrate overlapping with the display portion, where the first substrate and the second substrate are fixed so that one of surfaces of the first substrate and one of surfaces of the second substrate face each other, and where the chip including the semiconductor integrated circuit includes a driver circuit of the optical sensor portion and a driver circuit of the display portion.

Another structure of the present invention is a structure in which an IC is located over an FPC and a touch panel portion is included. The structure is a semiconductor device including a first substrate provided with a display portion, an optical sensor portion, and a terminal portion; a film including a wiring electrically connected to the terminal portion; at least one chip including a semiconductor integrated circuit that is mounted on the film; and a touch panel portion on one of surfaces of a second substrate overlapping with the display portion, where the first substrate and the second substrate are fixed so that one of surfaces of the first substrate and the one of the surfaces of the second substrate face each other, and where the chip including the semiconductor integrated circuit includes a driver circuit of the display portion, a driver circuit of the optical sensor portion, and a driver circuit of the touch panel portion.

Although the above structure shows that three kinds of driver circuits are included in one chip over the FPC, the structure is not particularly limited, and a structure in which two kinds of driver circuits are included in one chip over the FPC may be employed.

Another structure of the present invention is a structure in which two kinds of driver circuits that are a driver circuit of a display portion and a driver circuit of a touch panel portion are included. The structure is a semiconductor device including a first substrate provided with a display portion, an optical sensor portion, and a terminal portion; a film including a wiring electrically connected to the terminal portion; at least one chip including a semiconductor integrated circuit that is mounted on the film; and a touch panel portion on one of surfaces of a second substrate overlapping with the display portion, where the first substrate and the second substrate are fixed so that one of surfaces of the first substrate and the one of the surfaces of the second substrate face each other, and where the chip including the semiconductor integrated circuit includes a driver circuit of the display portion and a driver circuit of the touch panel portion.

Another structure of the present invention is a structure including two kinds of driver circuits that are a driver circuit of an optical sensor portion and a driver circuit of a touch panel portion. The structure is a semiconductor device including a first substrate provided with a display portion, an optical sensor portion, and a terminal portion; a film including a wiring electrically connected to the terminal portion; at least one chip including a semiconductor integrated circuit that is mounted on the film; and a touch panel portion on one of surfaces of a second substrate overlapping with the display portion, where the first substrate and the second substrate are fixed so that one of surfaces of the first substrate and the one of the surfaces of the second substrate face each other, and where the chip including the semiconductor integrated circuit includes a driver circuit of the optical sensor portion and a driver circuit of the touch panel portion.

In each of the above structures, the display portion emits light toward the outside, and reflected light of the emitted light is received by the optical sensor portion. In each of the above structures, the display portion includes a plurality of pixel electrodes and a plurality of transistors electrically connected to the pixel electrodes. In each of the above structures, the display portion includes an organic compound layer functioning as a light-emitting layer over the pixel electrode in the display portion. In each of the above structures, the optical sensor portion includes a light-receiving portion. In each of the above structures, the organic compound layer provided over the pixel electrode in the display portion includes the same material as a material of an organic compound layer in the optical sensor portion. It is preferable that the light-receiving portion in the optical sensor portion include the organic compound layer and include at least one layer shared by a light-emitting element including the organic compound layer in the display portion because a process is simplified.

In each of the above structures, the display portion includes a plurality of transistors using an oxide semiconductor (also referred to as OS transistors). Specifically, a metal oxide functioning as an oxide semiconductor including a channel formation region is used. For example, as the oxide semiconductor, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, tin, magnesium, and the like) is preferably used.

Instead of the transistors using an oxide semiconductor, LTPS (Low Temperature Polysilicon) transistors may be used. With use of the transistor using an oxide semiconductor or the LTPS transistor, a transistor for a pixel and a transistor for a driver circuit can be formed, over one substrate, through the same process. Examples of the driver circuit formed through the same process include a demultiplexer and a scan line driver circuit. Alternatively, what is called an LTPO structure in which an LTPS transistor and a transistor using an oxide semiconductor are formed may be employed.

Alternatively, one chip including a plurality of kinds of driver circuits may have a structure including a stack of a transistor provided in a single crystal silicon substrate and a transistor using an oxide semiconductor. For example, a circuit driving at high speed is formed with transistors provided in a single crystal silicon substrate and a circuit serving as a memory is formed with transistors using an oxide semiconductor, whereby the integration degree can be increased. Furthermore, transistors using an oxide semiconductor can have a layered structure.

Furthermore, one chip may have a structure including a circuit such as a receiving circuit, a charging circuit, or a CPU circuit, in addition to a plurality of kinds of driver circuits.

Effect of the Invention

According to one embodiment of the present invention, a plurality of kinds of driver circuits are integrated in one chip, whereby the number of components can be reduced, and the packaging efficiency can be improved.

According to one embodiment of the present invention, a display device with a touch sensor, which has multifunctionality and in which a driver circuit of a display portion, a driver circuit of an optical sensor, and a driver circuit of a touch sensor are formed in one IC, can be provided.

According to one embodiment, a novel semiconductor device can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 10A and FIG. 10B are cross-sectional views illustrating an example of a display device.

FIG. 11A and FIG. 11B are cross-sectional views illustrating an example of a display device.

FIG. 19A is a table showing classifications of crystal structures of IGZO. FIG. 19B is a graph showing an XRD spectrum of a CAAC-IGZO film. FIG. 19C is an image showing nanobeam electron diffraction patterns of a CAAC-IGZO film.

MODE FOR CARRYING OUT THE INVENTION

Figure 1A:
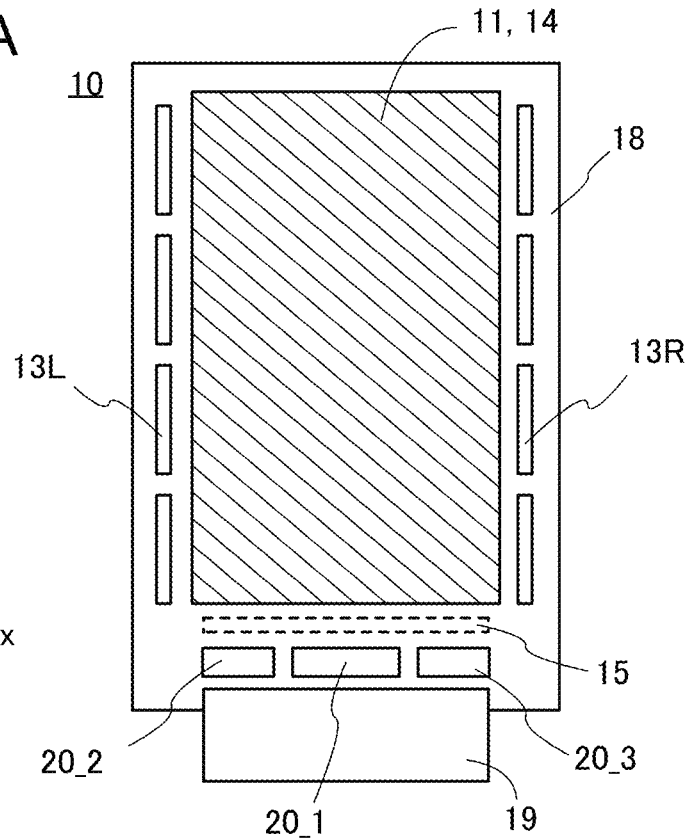
FIG. 1A and FIG. 1B are schematic views illustrating structure examples of a display device.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

In this specification, the embodiments described below can be combined as appropriate. In addition, in the case where a plurality of structure examples are described in one embodiment, the structure examples can be combined as appropriate.

In the drawings, the size, the layer thickness, or the region is exaggerated for clarity in some cases. Therefore, they are not limited to the illustrated scale. Note that the drawings schematically show ideal examples, and embodiments of the present invention are not limited to shapes or values shown in the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Embodiment 1

In this embodiment, a structure example of a display device relating to one embodiment of the present invention will be described with reference to FIG. 1, FIG. 2, FIG. 3, and FIG. 4.

FIG. 1A is a schematic view of a display device 10. FIG. 1A shows a positional relation of a display portion 11 and an optical sensor portion 14 with respect to peripheral circuits thereof. The schematic view shown in FIG. 1 includes the display portion 11, the optical sensor portion 14, IC columns 13L of a scan line driver circuit, IC columns 13R of the scan line driver circuit, a demultiplexer 15, an FPC (Flexible printed circuits) 19, an IC 20_1, an IC 20_2, and an IC 20_3 over a substrate 18. The IC 20_1 of the three arranged ICs is positioned at the center, and the ICs 20_2 and 20_3 are positioned on respective sides of the IC 20_1. The ICs 20_1 to 20_3 are connected to a host 16 illustrated in FIG. 2 through the FPC 19. The host 16 includes a CPU and a timing controller. The optical sensor portion 14 is formed at the same position as the display portion 11 over the substrate 18 as illustrated in FIG. 1A. Note that the same position mentioned here does not mean an overlapping position, and a minute display region (light-emitting region) and a minute optical sensor region (light-receiving region) are located so as not to overlap with each other.

Part of a driver circuit of the display portion 11 and part of a driver circuit of the optical sensor portion 14 are formed together in each IC of the IC columns 13L of the scan line driver circuit and the IC columns 13R of the scan line driver circuit.

Although FIG. 1A shows an example in which eight ICs, the sum of the IC columns 13L of the scan line driver circuit and the IC columns 13R of the scan line driver circuit, are arranged, there is no particular limitation on the location. The eight ICs may be located on the left or right side, or located in the periphery of the IC 20_1, the IC 20_2, and the IC 20_3. Note that the IC arrangement is not limited to the example of the eight ICs, and the arrangement of one IC is acceptable in order to reduce the number of components. Moreover, in the case of a display portion including the pixel count for 8K, eight or more ICs may be arranged.

Figure 1B:
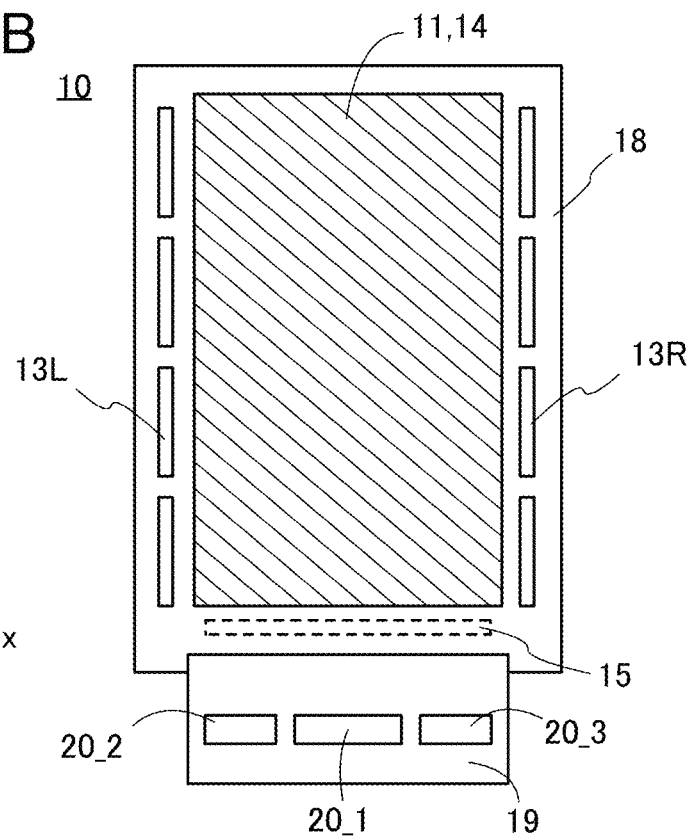

The ICs 20_1 to 20_3 may be provided by a packaging method such as a COF (Chip On Film) method or TCP (Tape Carrier Package). FIG. 1B illustrates an example in which the ICs 20_1 to 20_3 are arranged over the FPC 19. The arrangement of the ICs 20_1 to 20_3 over the FPC 19 enables an area of the substrate 18 to be reduced, whereby the display device 10 can be downsized.

In addition, the IC columns 13L of the scan line driver circuit and the IC columns 13R of the scan line driver circuit may also be provided over the FPC by a packaging method such as a COF method or TCP.

Note that FIG. 1A and FIG. 1B each illustrate an example of including 11 ICs in total, the breakdown of which is the three ICs of the IC 20_1, the IC 202, and the IC 203, the four ICs of the IC columns 13L of the scan line driver circuit, and the four ICs of the IC columns 13R of the scan line driver circuit; however, the number of ICs is not limited thereto.

The display device 10 can include 11 or more ICs. FIG. 1B illustrates an example in which the ICs 20_1 to 20_3 are connected to one FPC; however, one embodiment of the present invention is not limited thereto. Respective FPCs may be provided for the ICs.

In the case where the number of components is reduced, the total number of ICs can be three in such a manner that the three ICs of the IC 20_1, the IC 20_2, and the IC 20_3 are merged into one IC, the four ICs of the IC columns 13L of the scan line driver circuit are merged into one IC, and the four ICs of the IC columns 13R of the scan line driver circuit are merged into one IC. In the case where the area of the display portion is small, all the ICs can be merged into one IC.

Figure 2:
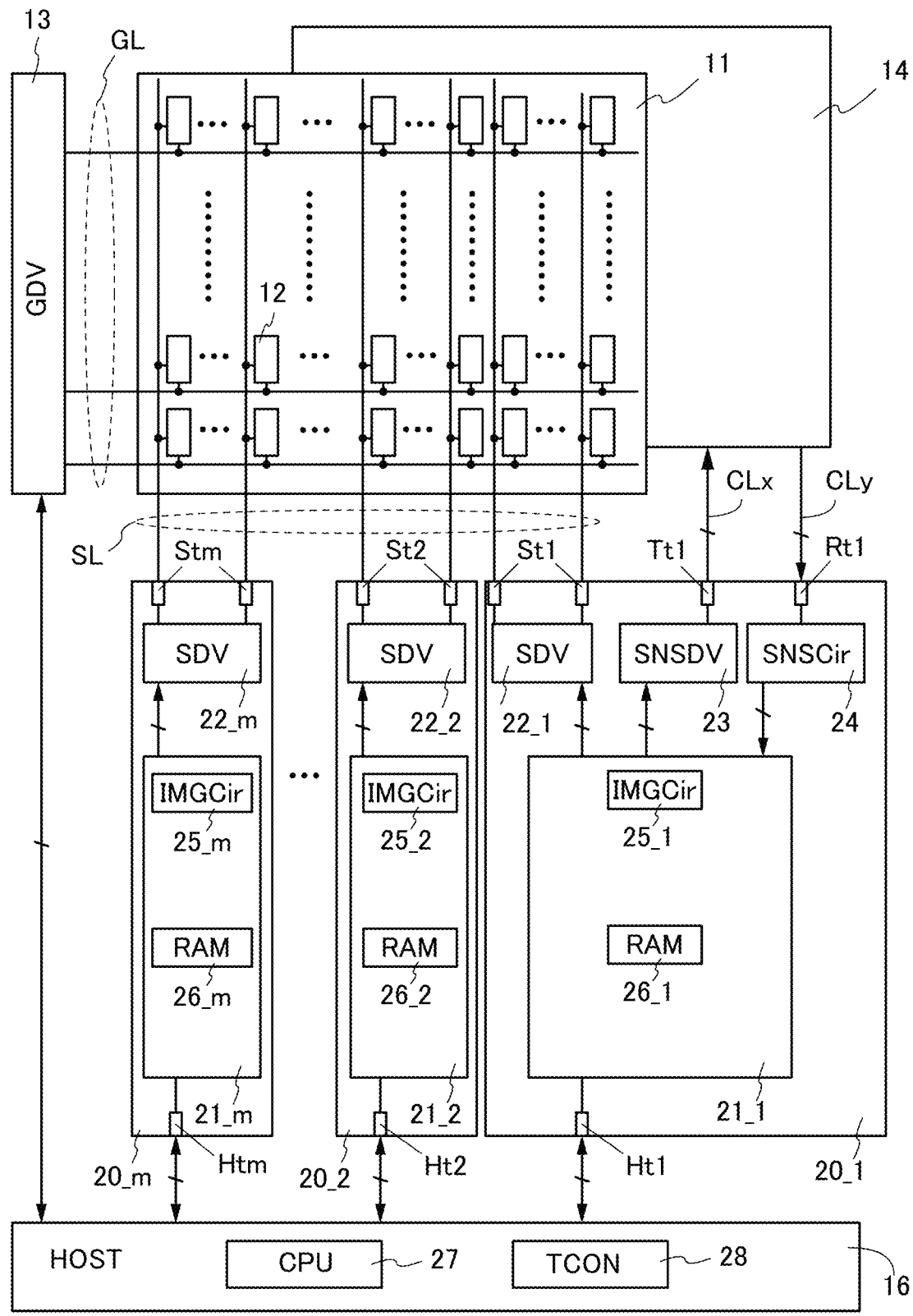
FIG. 2 is a circuit block diagram illustrating a structure example of a display device.

FIG. 2 is a circuit block diagram illustrating a structure example of the display device 10 of one embodiment of the present invention. The display device 10 includes the display portion 11, the optical sensor portion 14, a scan line driver circuit 13, ICs 20_1 to 20_$m$ ($m$ is an integer greater than or equal to 2), and the host 16.

The display portion 11 includes a plurality of pixels 12 arranged in a matrix, a plurality of scan lines GL, and a plurality of signal lines SL, and has a function of displaying an image.

The display portion 11 can display an image by control of emission/non-emission of the pixel 12. For the pixel 12, a liquid crystal element or an EL (electroluminescence) element (note that the EL element contains one or both of an organic compound and an inorganic compound) can be used, for example. Besides, the pixel 12 can includes at least one of, for example, an LED chip (a white LED chip, a red LED chip, a green LED chip, a blue LED chip, or the like), a transistor (a transistor that emits light depending on current flow), an electron emitter, a display element including a carbon nanotube, electronic ink, an electrowetting element, an electrophoretic element, a display element using MEMS (micro electro mechanical systems) (such as a GLV (grating light valve), a DMD (digital micromirror device), a DMS (digital micro shutter), MIRASOL (registered trademark), an IMOD (interferometric modulation) element, a MEMS shutter display element, an optical-interference-type MEMS display element, or a piezoelectric ceramic display), a quantum dot, and the like.

In this embodiment, an EL element containing an organic compound layer is used for the pixel 12.

The pixel count in the display portion 11 is preferably as high as HD (pixel count: 1280×720), FHD (pixel count: 1920×1080), WQHD (pixel count: 2560×1440), WQXGA (pixel count: 2560×1600), 4K, or 8K. In particular, the pixel count of 4K, 8K, or higher is preferable. The pixel density (definition) of the pixels in the display portion 11 is higher than or equal to 300 ppi, preferably higher than or equal to 500 ppi, further preferably higher than or equal to 800 ppi, further preferably higher than or equal to 1000 ppi, further preferably higher than or equal to 1200 ppi. The display portion 11 with such a large number of pixels and high definition enables an increase in a realistic sensation, sense of depth, and the like in personal use such as portable use and home use.

The scan line driver circuit 13 is electrically connected to the pixels 12 through the scan lines GL. The scan line driver circuit 13 has a function of outputting scan signals to the scan lines GL. The scan line driver circuit 13 is referred to as a gate driver in some cases.

The IC 20_1 includes a circuit 21_1, a signal line driver circuit 22_1, a driver circuit 23 of the optical sensor portion, and a detection circuit 24 of the optical sensor portion. The IC 20_2 includes a circuit 21_2 and a signal line driver circuit 22_2. Similarly, the IC 20_$m$ includes a circuit 21_$m$ and a signal line driver circuit 22_$m$. In the following description, the ICs 20_1 to 20_$m$ are collectively referred to as IC 20_1 to 20_3, and the signal line driver circuits 22_1 to 22_$m$ are collectively referred to as a signal line driver circuit 22 in some cases.

The IC 20_1 is electrically connected to the signal line SL via a terminal St1, to the host 16 via a terminal Ht1, to a wiring CLx via a terminal Tt1, and to a wiring CLy via a terminal Rt1. The IC 20_2 is electrically connected to the signal line SL via a terminal St2 and to the host 16 via a terminal Ht2. Similarly, the IC 20_$m$ is electrically connected to the signal line SL via a terminal Stm and to the host 16 via a terminal Htm.

The ICs 20_1 to 20_$m$ are preferably formed using a plurality of IC chips (hereinafter referred to as an IC). For example, the case where an IC 20 is one IC is considered. As the resolution of the display portion 11 is increased like 4K or 8K, the number of signal lines SL is increased. Consequently, the area occupied by the IC is increased. An IC occupying a large area is difficult to manufacture and requires high price. Furthermore, when the IC is crimped to a substrate (or a film, for example), the pressure for each terminal of the IC needs to be optimal. In the case where the display portion 11 has a high pixel count like 4K or 8K, the number of terminals of the IC is also increased significantly, and accordingly, a load for the entire IC in the crimp is also increased. As a result, a crack or the like occurs in the IC, and thus, the IC is difficult to mount. In the case where the ICs 20_1 to 20_3 are formed using a plurality of ICs, a load for each IC is small, and thus, the IC is easily mounted.

The signal line driver circuit 22 has a function of outputting image signals (also referred to as video signals) to the display portion 11. The signal line driver circuit 22 has a function of supplying image signals which are analog signals to the pixels 12 of the display portion 11 via the signal lines SL. For example, the signal line driver circuit 22 can include a shift register circuit and a buffer circuit in combination. The display device 10 may include a demultiplexer circuit connected to the signal lines SL. The signal line driver circuit 22 is referred to as a source driver in some cases.

The driver circuit 23 of the optical sensor portion is electrically connected to the optical sensor portion 14 via the wiring CLx. The driver circuit 23 of the optical sensor portion has a function of outputting a signal for driving a sensor element in the optical sensor portion 14. As the driver circuit 23 of the optical sensor portion, a shift register circuit and a buffer circuit can be used in combination, for example.

The detection circuit 24 of the optical sensor portion is electrically connected to the optical sensor portion 14 via the wiring CLy. The detection circuit 24 of the optical sensor portion has a function of outputting an output signal from a sensor element in the optical sensor portion 14 to the circuit 21_1. The detection circuit 24 of the optical sensor portion can include an amplifier circuit and an analog-digital converter (ADC), for example. The detection circuit 24 of the optical sensor portion converts an analog signal output from the optical sensor portion 14 into a digital signal and outputs the digital signal to the circuit 21_1.

In FIG. 2, the IC 20_1 is connected to the pixel 12 at an end of the display portion 11; however, one embodiment of the present invention is not limited thereto. The IC 20_1 may be connected to the pixel 12 in the center portion or another portion of the display portion 11.

The circuit 21_1 includes an image processing circuit 25_1 and a RAM 26_1. Similarly, the circuit 21_$m$ includes an image processing circuit 25_$m$ and a RAM 26_$m$. In the following description, image processing circuits 25_1 to 25_$m$ are collectively referred to as an image processing circuit 25, and RAMs 26_1 to 26_$m$ are collectively referred to as a RAM 26 in some cases.

The image processing circuit 25 has a function of generating an image signal in response to an instruction from the host 16. Furthermore, the image processing circuit 25 has a function of performing signal processing on an image signal in accordance with the specifications of the display portion 11, converting the signal into an analog image signal, and supplying the analog image signal to the signal line driver circuit 22. The image processing circuit 25_1 has a function of generating a driver signal to be output to the driver circuit 23 of the optical sensor portion, in response to an instruction from the host 16. In addition, the image processing circuit 25_1 has a function of analyzing a signal input from the detection circuit 24 of the optical sensor portion and outputting the signal as positional data to the host 16. In addition, the image processing circuit 25_1 has a function of analyzing a signal input from the detection circuit 24 of the optical sensor portion and outputting the signal as image data to the host 16.

The RAM 26 has a function of retaining data needed for processing in the image processing circuit 25. The RAM 26 may have a function of temporarily retaining data (e.g., a positional data) processed by the image processing circuit.

The image processing circuit 25 can have a structure including, for example, a processor. A microprocessor such as a DSP (Digital Signal Processor) or a GPU (Graphics Processing Unit) can be used, for example. A structure may be employed in which such a microprocessor is obtained with a PLD (Programmable Logic Device) such as an FPGA (Field Programmable Gate Array) or an FPAA (Field Programmable Analog Array). The processor interprets and executes instructions from various programs to process various kinds of data and control programs.

The host 16 includes a CPU 27 and a timing controller 28.

To the timing controller 28, a variety of synchronization signals which determine timing of updating the display portion 11 are input. Examples of the synchronization signals include a horizontal synchronization signal, a vertical synchronization signal, and a reference clock signal. The timing controller 28 generates control signals for the scan line driver circuit 13, the signal line driver circuit 22, and the driver circuit 23 of the optical sensor portion from these signals. Furthermore, the timing controller 28 may have a function of generating a signal for determining timing when the detection circuit 24 of the optical sensor portion outputs a signal. Here, the timing controller 28 preferably outputs a signal synchronized with the signal output to the scan line driver circuit 13 and a signal synchronized with the signal output to the driver circuit 23 of the optical sensor portion. In particular, it is preferable that a period in which data in the display portion 11 is rewritten and a period in which sensing is performed with the optical sensor portion 14 be separately provided. For example, the display device 10 can be driven by dividing one frame period into a period in which data in the display portion 11 is rewritten and a period in which sensing is performed. Furthermore, detection sensitivity and detection accuracy can be increased, for example, by providing two or more sensing periods in one frame period.

The CPU 27 has a function of executing an instruction and controlling the display device 10 collectively. The CPU 27 executes an instruction input from the outside and an instruction stored in an internal memory. The CPU 27 generates signals for controlling the timing controller 28 and the image processing circuit 25.

When the timing controller 28 is included in the host 16, the IC 20 does not necessarily include a timing controller. Accordingly, the area occupied by the IC can be reduced. In addition, the price of the IC can be reduced. Furthermore, one timing controller can control of the timing of a plurality of ICs.

The optical sensor portion 14 includes a plurality of optical sensor elements which sense the contact or approach of an object to the display device 10. In this embodiment, the optical sensor portion 14 employs an optical system. The detailed description of the optical sensor portion 14 will be described in Embodiment 2.

The display device 10 may be provided not only with an optical system in the optical sensor portion 14 but also with a capacitive touch sensor portion. When different sensing systems are implemented in the display device 10, a capacitive sensing system and an optical system, each of which is used as a sensor for a touch panel, can be switched appropriately. For example, assuming that a touch panel is used outdoors in rainy weather at night, there is a risk of malfunction of the capacitive sensing system if a droplet exists on a panel plane. In such a case, the touch panel can be switched to an optical touch panel. The sensing system for the touch sensor portion is not limited to the capacitive sensing system. Instead of the capacitive sensing system, a variety of systems such as a resistive system, a surface acoustic wave system, and an infrared system can be employed. In the case of an infrared system, biological data such as a vein can be obtained, for example.

FIG. 3A, FIG. 3B, FIG. 3C, and FIG. 3D are each a schematic cross-sectional view in which a capacitive touch sensor is further provided.

Figure 3A:
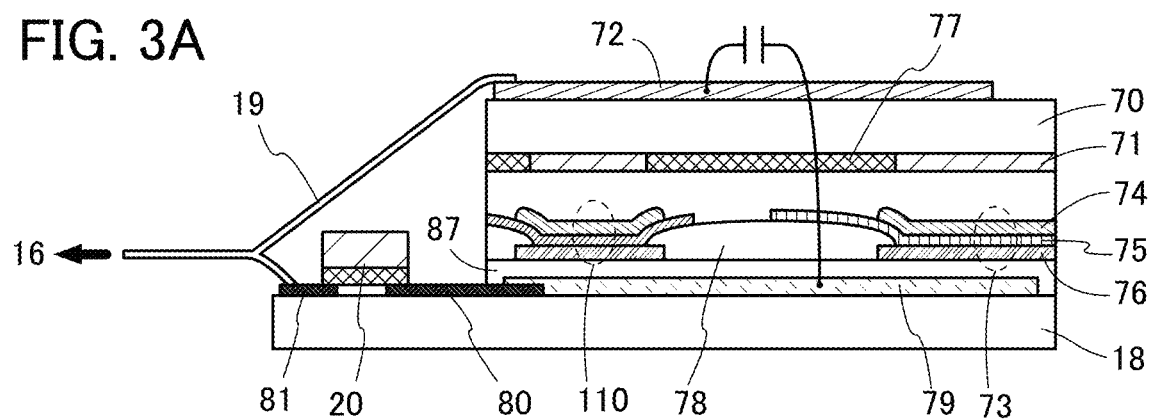
FIG. 3A, FIG. 3B, FIG. 3C, and FIG. 3D are schematic cross-sectional views each illustrating a sensing system of a display device.

The display device illustrated in FIG. 3A includes the substrate 18, a substrate 70, the FPC 19, the IC 20, an EL element 73, a light-receiving element 110, an insulating film 78, an insulating film 87, a conductive film 72, a conductive film 79, a conductive film 80, a conductive film 81, a coloring film 71, a light-blocking film 77, and the like. Although not illustrated, a transistor or the like is preferably provided between the substrate 18 and the EL element 73. Furthermore, the conductive film 79 preferably has a function of a gate electrode, a source electrode, or a drain electrode of a transistor. The light-receiving element 110 is an optical sensor and can be referred to as one element included in the optical sensor portion 14.

In FIG. 3A, FIG. 3B, FIG. 3C, and FIG. 3D, the IC 20 has a structure including at least part of a driver circuit of a capacitive touch panel.

The EL element 73 includes a conductive film 74, an EL layer 75, and a conductive film 76. The conductive film 74 functions as one of an anode and a cathode of the EL element 73, and the conductive film 76 functions as the other of the anode and the cathode of the EL element 73. The conductive film 76 functions as a reflective film, and the conductive film 74 has a function of transmitting visible light. The EL layer 75 includes a light-emitting layer, and when voltage is applied between the conductive film 74 and the conductive film 76, current flows through the EL layer 75, so that the light-emitting layer in the EL layer 75 emits light. The light emitted from the EL layer 75 is extracted to the outside of the display device through the coloring film 71 and the substrate 70. The display device illustrated in FIG. 3A includes what is called a top-emission display device. The EL layer 75 formed over the insulating film 78 does not emit light because current does not flow through the EL layer 75. The light-blocking film 77 may be provided between the insulating film 78 and the substrate 70. By providing the light-blocking film 77, the visibility of the display device can be improved.

The touch sensor portion can perform sensing by utilizing a capacitor formed between the conductive film 79 and the conductive film 72 on the substrate 70 side. In other words, the conductive film 72 functions as one of the wiring CLx and the wiring CLy and the conductive film 79 functions as the other of the wiring CLx and the wiring CLy. Thus, the conductive film functioning as the electrode of the transistor also serves as the electrode of the touch sensor, which can lead to a simple process and low manufacturing cost.

As illustrated in FIG. 3A, the conductive film 74 over the insulating film 78 is preferably removed. This is because when the conductive film 74 exists over the insulating film 78, the conductive film 74 blocks an electric flux line formed between the conductive film 72 and the conductive film 79 and thus impairs the function of the touch sensor.

The conductive film 79 is electrically connected to the IC 20 through the conductive film 80. The conductive film 72 is electrically connected to the IC 20 through the FPC 19. The IC 20 is electrically connected to the host 16 through the conductive film 81 and the FPC 19. Note that the conductive film 80 and the conductive film 81 may be formed through the same step as the conductive film 79.

Figure 3B:
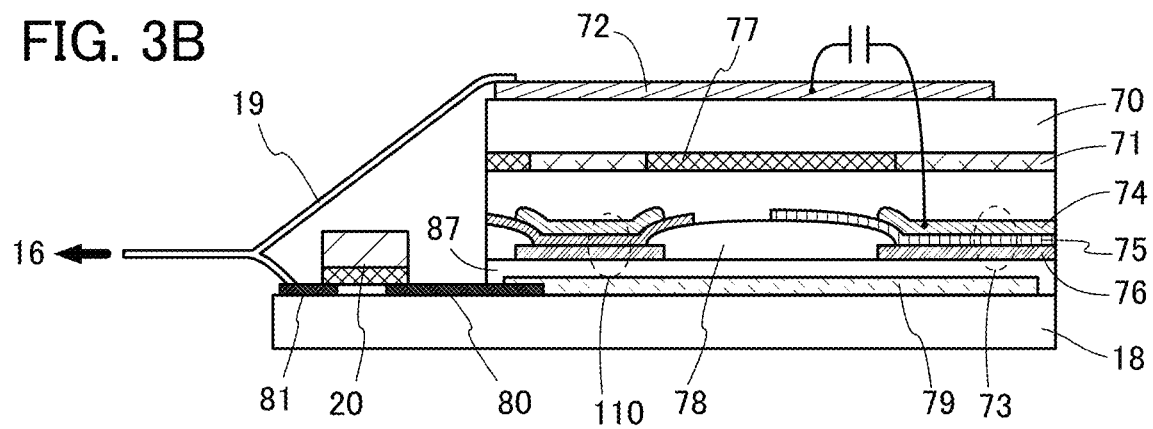

The touch sensor in the display device illustrated in FIG. 3A may be formed using a capacitor formed between the conductive film 72 and the conductive film 74. An example thereof is illustrated in FIG. 3B. In FIG. 3B, the conductive film 72 functions as one of the wiring CLx and the wiring CLy, and the conductive film 74 functions as the other of the wiring CLx and the wiring CLy. The conductive film 72 is electrically connected to the IC 20 through the FPC 19. The conductive film 74 is electrically connected to the IC 20 through a conductive film (not illustrated) formed over the substrate 18.

Figure 3C:
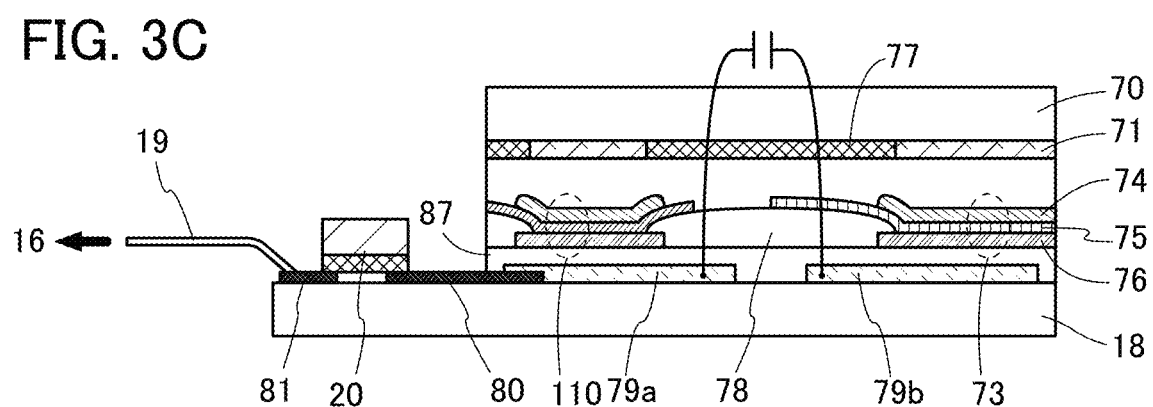

The display device in FIG. 3C is an example in which the conductive film 72 is removed from the structure illustrated in FIG. 3A and the touch sensor is formed using a capacitor formed between a pair of wirings of the conductive film 79 (a conductive film 79a and a conductive film 79b). In other words, the conductive film 79a functions as one of the wiring CLx and the wiring CLy and the conductive film 79b functions as the other of the wiring CLx and the wiring CLy. The conductive film 79a is electrically connected to the IC 20 through the conductive film 80. The conductive film 79b is electrically connected to the IC 20 through a conductive film (not illustrated) formed over the substrate 18. With such a structure, the steps can be simpler than those of the structure illustrated in FIG. 3A.

Figure 3D:
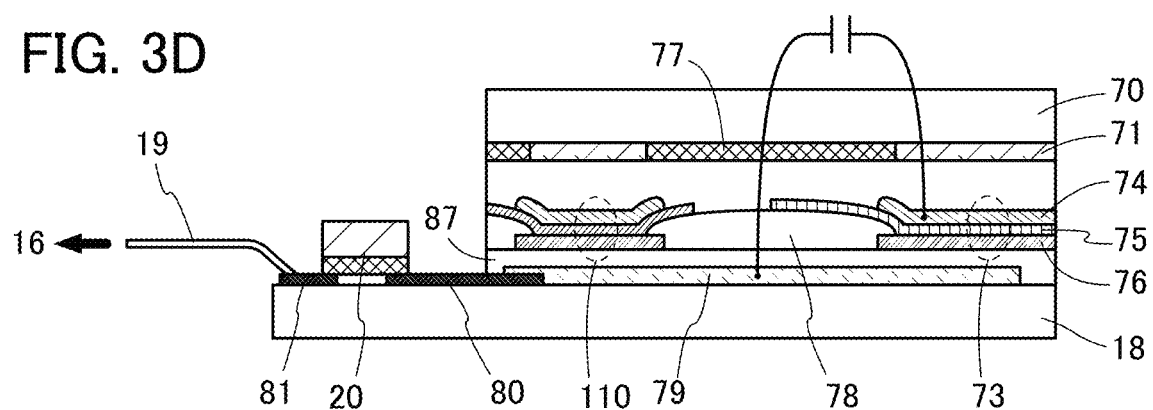

The display device in FIG. 3D is an example in which the conductive film 72 is removed from the structure illustrated in FIG. 3A and the touch sensor is formed using a capacitor formed between the conductive film 74 and the conductive film 79. In other words, the conductive film 74 functions as one of the wiring CLx and the wiring CLy and the conductive film 79 functions as the other of the wiring CLx and the wiring CLy. The conductive film 79 is electrically connected to the IC 20 through the conductive film 80. The conductive film 74 is electrically connected to the IC 20 through a conductive film (not illustrated) formed over the substrate 18. With such a structure, the steps can be simpler than those of the structure illustrated in FIG. 3A.

Figure 4:
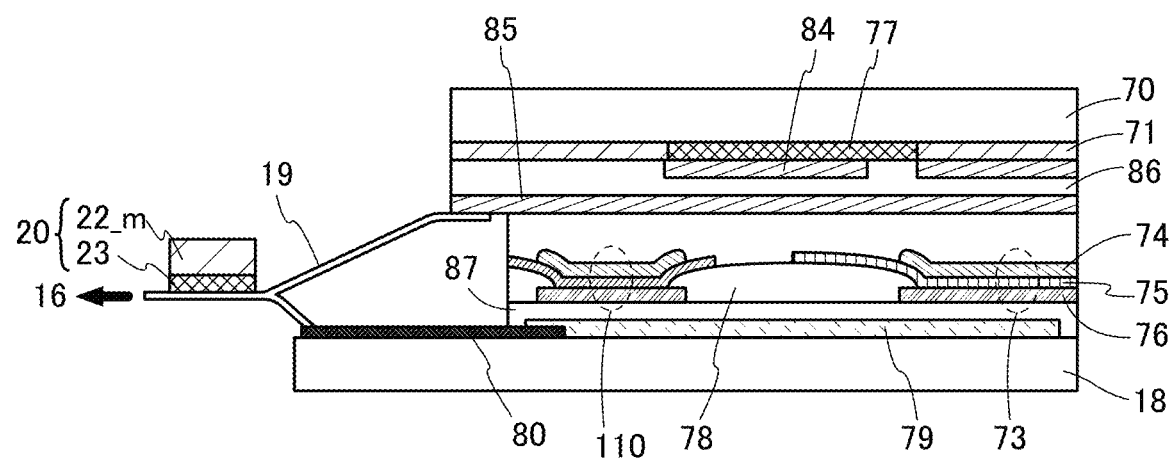
FIG. 4 is a schematic cross-sectional view illustrating a sensing system of a display device.

FIG. 4 illustrates a structure example of COF. FIG. 4 is a schematic cross-sectional view where a capacitive touch sensor is provided on the substrate 70 side. A touch sensor is formed using a capacitor formed between a conductive film 84 and a conductive film 85. In other words, the conductive film 84 functions as one of the wiring CLx and the wiring CLy and the conductive film 85 functions as the other of the wiring CLx and the wiring CLy. The conductive film 85 and the conductive film 84 are electrically connected to the IC 20 through the FPC 19.

The IC 20 is formed using a transistor provided in a single crystal silicon substrate. In FIG. 4, the IC 20 has a stacked structure of the signal line driver circuit 22_m and the driver circuit 23 of the optical sensor portion. For example, the signal line driver circuit 22_m can be formed using transistors provided in a single crystal silicon substrate, and the driver circuit 23 of the optical sensor portion can be formed using OS transistors. Furthermore, in the case where such driver circuits have a shared circuit, the circuit scale can be further reduced.

Alternatively, the IC 20 may be an IC chip in which a transistor including an oxide semiconductor in a channel region is formed over a transistor using a single crystal silicon substrate.

A plurality of kinds of circuits can be stacked by stacking transistors including an oxide semiconductor in channel regions.

Note that the details of the IC chip in which the transistor including an oxide semiconductor in a channel region is formed over a transistor formed using the single crystal silicon substrate are described later in Embodiment 3.

In the structure of FIG. 3 or FIG. 4, a signal line driver circuit for display pixels, a driver circuit for a capacitive touch sensor, and a signal line driver circuit for an optical sensor may be integrated in one chip. The driver circuits may be combined in various patterns to be integrated in one chip. At least two of the signal line driver circuit for display pixels, the driver circuit for a capacitive touch sensor, and the signal line driver circuit for an optical sensor may be selected and integrated in one chip. At least one of the signal line driver circuit for display pixels, the driver circuit for a capacitive touch sensor, and the signal line driver circuit for an optical sensor is not necessarily integrated with the other driver circuits in one chip.

For example, a plurality of IC chips may be mounted on one display device 10. In that case, which driver circuits are integrated in one chip may be considered in various combination patterns for each IC chip.

For example, one display device 10 may include the following IC chips: an IC chip A where the signal line driver circuit for display pixels and the driver circuit for a capacitive touch sensor are integrated in one chip; an IC chip B where the signal line driver circuit for display pixels and the signal line driver circuit for an optical sensor are integrated in one chip; and an IC chip C where only the signal line driver circuit for display pixels is in one chip.

For another example, one display device 10 may include the following IC chips: an IC chip D where the signal line driver circuit for display pixels, the driver circuit for a capacitive touch sensor, and the signal line driver circuit for an optical sensor are integrated in one chip; and the IC chip B where the signal line driver circuit for display pixels and the signal line driver circuit for an optical sensor are integrated in one chip.

For another example, one display device 10 may include the following IC chips: the IC chip C where only the signal line driver circuit for display pixels is in one chip; and an IC chip E where the driver circuit for a capacitive touch sensor and the signal line driver circuit for an optical sensor are integrated in one chip.

For another example, one display device 10 may include the following IC chips: the IC chip D where the signal line driver circuit for display pixels, the driver circuit for a capacitive touch sensor, and the signal line driver circuit for an optical sensor are integrated in one chip; and the IC chip B where the signal line driver circuit for display pixels and the signal line driver circuit for an optical sensor are integrated in one chip.

In addition, circuits for supplying a signal to a scan line driver circuit may be in one chip. For example, the following circuits may be integrated in one chip: a circuit for supplying a start pulse signal or a clock signal to a scan line driver circuit for OS transistors (or LTPS transistors) for display pixels; and a circuit for supplying a start pulse signal or a clock signal to a scan line driver circuit for OS transistors (or LTPS transistors) for optical sensors. Furthermore, these circuits may be integrated in at least one of the IC chip A, the IC chip B, the IC chip C, and the IC chip D.

Note that the LTPS (Low Temperature Polysilicon) transistor refers to a transistor whose channel formation region uses a polysilicon film formed with a low-temperature process over a glass substrate or a plastic film.

As described in this embodiment, a plurality of different kinds of driver circuits are integrated in one chip, whereby the number of components can be reduced, and the packaging efficiency can be improved.

The display device 10 described in this embodiment has multifunctionality and enables a display device provided with a touch sensor, where a driver circuit for a display portion, a driver circuit for an optical sensor, and a driver circuit for a touch sensor are formed with one IC, to be formed.

Embodiment 2

In this embodiment, top and cross-sectional structures of the optical sensor portion 14 described in Embodiment 1 and a display device including the optical sensor portion 14 will be described below.

A display device described below as an example is a device having a function of displaying an image and a function of capturing an image of an object overlapping with a screen.

The display device of this embodiment includes light-receiving elements and light-emitting elements in its display portion. Specifically, the light-emitting elements are arranged in a matrix in the display portion, and an image can be displayed on the display portion. Moreover, the light-receiving elements are arranged in a matrix in the display portion, so that the display portion also has a function of a light-receiving portion. The light-receiving portion can be used as an image sensor or a touch sensor. That is, by sensing light with the light-receiving portion, image data, i.e., imaging, can be obtained and the approach or contact of an object (e.g., a finger or a stylus) can be detected.

In the display device of this embodiment, when an object reflects light emitted from the light-emitting element included in the display portion, the light-receiving element can sense the reflected light; thus, imaging and touch (including near touch) detection are possible even in a dark place.

The display device of this embodiment has a function of displaying an image with use of a light-emitting element. That is, the light-emitting element functions as a display element.

As the light-emitting element, an EL element such as an OLED (Organic Light Emitting Diode) or a QLED (Quantum-dot Light Emitting Diode) is preferably used. As a light-emitting substance included in the EL element, a substance which emits fluorescence (a fluorescent material), a substance which emits phosphorescence (a phosphorescent material), an inorganic compound (e.g., a quantum dot material), a substance which exhibits thermally activated delayed fluorescence (a thermally activated delayed fluorescent (TADF) material), and the like can be given. Alternatively, an LED (a light-emitting diode) such as a micro-LED can be used as the light-emitting element.

The display device of this embodiment has a function of sensing light with use of a light-receiving element.

When the light-receiving element is used as an image sensor, the display device of this embodiment can capture an image using the light-receiving element.

For example, data on a fingerprint, a palm print, an iris, or the like can be obtained with use of the image sensor. That is, a biological authentication sensor can be incorporated in the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of the user can be obtained with use of the image sensor. By analysis of the data, information on the user's physical and mental state can be obtained. Changing the output contents of one or both of display and sound on the basis of the data allows the user to safely use a device for VR (Virtual Reality), a device for AR (Augmented Reality), or a device for MR (Mixed Reality), for example.

When the light-receiving element is used as the touch sensor, the display device of this embodiment can detect the approach or contact of an object with use of the light-receiving element.

As the light-receiving element, a pn photodiode or a pin photodiode can be used, for example. The light-receiving element functions as a photoelectric conversion element that senses light incident on the light-receiving element and generates charge. The amount of generated charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements are used as the light-emitting elements, and organic photodiodes are used as the light-receiving elements. A large number of layers of the organic photodiode can be shared with the organic EL element. Accordingly, the light-receiving element can be incorporated into the display device without a significant increase in the number of manufacturing steps. For example, an active layer of the light-receiving element and a light-emitting layer of the light-emitting element are separately formed, and the other layers can be shared by the light-emitting element and the light-receiving element.

FIG. 5A, FIG. 5B, FIG. 5C, and FIG. 5D are schematic cross-sectional views each illustrating a part of the display device of one embodiment of the present invention.

Figure 5A:
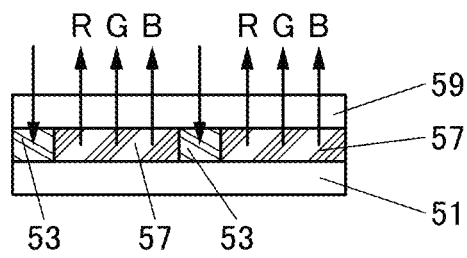
FIG. 5A, FIG. 5B, FIG. 5C, and FIG. 5D are cross-sectional views illustrating examples of display devices.

A display device 50A illustrated in FIG. 5A includes a layer 53 including a light-receiving element and a layer 57 including a light-emitting element between a substrate 51 and a substrate 59.

Figure 5B:
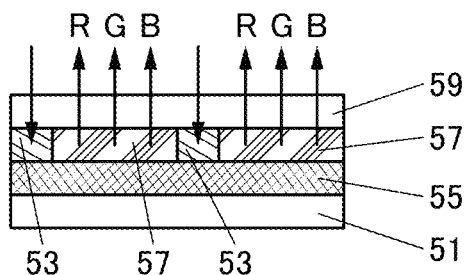

A display device 50B illustrated in FIG. 5B includes the layer 53 including a light-receiving element, a layer 55 including transistors, and the layer 57 including a light-emitting element between the substrate 51 and the substrate 59.

In the display device 50A and the display device 50B, red (R) light, green (G) light, and blue (B) light are emitted from the layer 57 including a light-emitting element.

The display device of one embodiment of the present invention includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes a light-receiving element. The light-receiving element may be provided in all the pixels or may be provided in some of the pixels. In addition, one pixel may include a plurality of light-receiving elements.

The layer 55 including transistors preferably includes a first transistor and a second transistor. The first transistor is electrically connected to the light-receiving element. The second transistor is electrically connected to the light-emitting element.

Figure 5C:
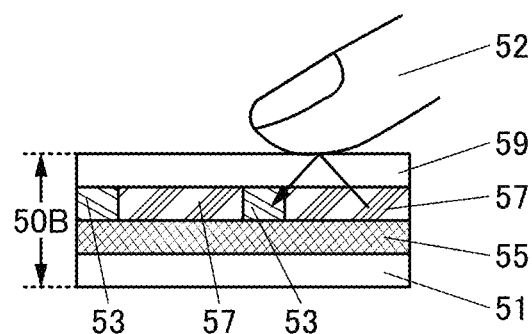

The display device of one embodiment of the present invention may have a function of detecting an object such as a finger that is touching the display device. For example, after light emitted from the light-emitting element in the layer 57 including a light-emitting element is reflected by a finger 52 that touches the display device 50B as illustrated in FIG. 5C, the light-receiving element in the layer 53 including a light-receiving element senses the reflected light. Thus, the touch of the finger 52 on the display device 50B can be detected.

Figure 5D:
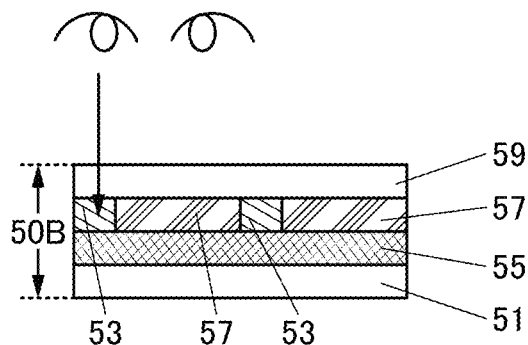

The display device of one embodiment of the present invention may have a function of detecting an object that is close to (but is not touching) the display device 50B as illustrated in FIG. 5D or capturing an image of such an object.

FIG. 5E, FIG. 5F, FIG. 5G, and FIG. 5H each illustrate an example of a pixel.

Figure 5E:
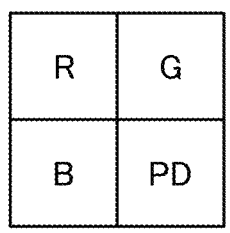
FIG. 5E, FIG. 5F, FIG. 5G, and FIG. 5H are top views illustrating examples of pixels.
Figure 5F:
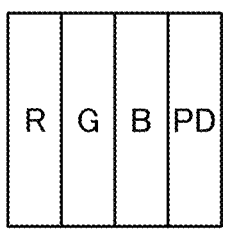

The pixel illustrated in each of FIG. 5E and FIG. 5F includes three subpixels (three light-emitting elements) of R, G, and B and a light-receiving element PD. FIG. 5E illustrates an example in which the three subpixels and the light-receiving element PD are arranged in a 2×2 matrix, and FIG. 5F illustrates an example in which the three subpixels and the light-receiving element PD are arranged horizontally in one line.

Figure 5G:
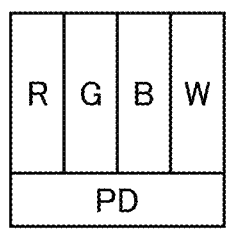

The pixel illustrated in FIG. 5G includes four subpixels (four light-emitting elements) of R, G, B, and W and the light-receiving element PD.

Figure 5H:
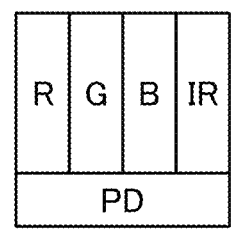

The pixel illustrated in FIG. 5H includes three subpixels of R, G, and B, a light-emitting element IR that emits infrared light, and the light-receiving element PD. Here, the light-receiving element PD preferably has a function of sensing infrared light. The light-emitting element PD may have a function of sensing both visible light and infrared light. The wavelength of light sensed by the light-receiving element PD can be determined depending on the application of the sensor.

A more detailed structure of the display device of one embodiment of the present invention will be described below with reference to FIG. 6, FIG. 7, and FIG. 8.

Figure 6A:
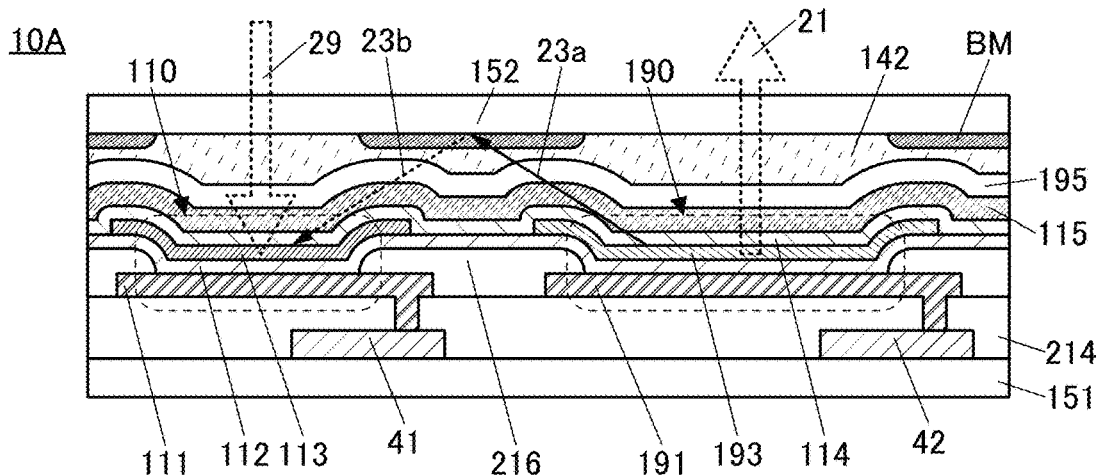
FIG. 6A, FIG. 6B, and FIG. 6C are each a cross-sectional view illustrating an example of a display device.

FIG. 6A illustrates a cross-sectional view of a display device 10A.

The display device 10A includes a light-receiving element 110 and a light-emitting element 190.

The light-receiving element 110 includes a pixel electrode 111, a common layer 112, an active layer 113, a common layer 114, and a common electrode 115.

The light-emitting element 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is a layer shared by the light-receiving element 110 and the light-emitting element 190.

The active layer 113 overlaps with the pixel electrode 111 with the common layer 112 therebetween. The light-emitting layer 193 overlaps with the pixel electrode 191 with the common layer 112 therebetween. The active layer 113 includes a first organic compound, and the light-emitting layer 193 includes a second organic compound that is different from the first organic compound.

The common layer 114 is positioned over the common layer 112, the active layer 113, and the light-emitting layer 193. The common layer 114 is a layer shared by the light-receiving element 110 and the light-emitting element 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is a layer shared by the light-receiving element 110 and the light-emitting element 190.

In the display device of this embodiment, an organic compound is used for the active layer 113 of the light-receiving element 110. In the light-receiving element 110, the layers other than the active layer 113 can have structures in common with the layers in the light-emitting element 190 (EL element). Therefore, the light-receiving element 110 can be formed concurrently with the formation of the light-emitting element 190 only by adding a step of depositing the active layer 113 in the manufacturing process of the light-emitting element 190.

The light-emitting element 190 and the light-receiving element 110 can be formed over one substrate. Accordingly, the light-receiving element 110 can be incorporated into the display device without a significant increase in the number of manufacturing steps.

The display device 10A illustrates an example in which the light-receiving element 110 and the light-emitting element 190 have a common structure except that the active layer 113 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include a separately formed layer other than the active layer 113 and the light-emitting layer 193 (see display devices 10K, 10L, and 10M described later). The light-receiving element 110 and the light-emitting element 190 preferably include at least one layer used in common (common layer). Thus, the light-receiving element 110 can be incorporated into the display device without a significant increase in the number of manufacturing steps.

The display device 10A includes the light-receiving element 110, the light-emitting element 190, a transistor 41, a transistor 42, and the like between a pair of substrates (a substrate 151 and a substrate 152).

In the light-receiving element 110, the common layer 112, the active layer 113, and the common layer 114, which are positioned between the pixel electrode 111 and the common electrode 115, can each also be referred to as an organic layer (a layer including an organic compound). The pixel electrode 111 preferably has a function of reflecting visible light. An end portion of the pixel electrode 111 is covered with a bank 216. The common electrode 115 has a function of transmitting visible light.

The light-receiving element 110 has a function of sensing light. Specifically, the light-receiving element 110 is a photoelectric conversion element that receives light 29 incident from the outside of the display device 10A and converts it into an electric signal. The light 29 can also be expressed as light that is emitted from the light-emitting element 190 and then reflected by an object. The light 29 may enter the light-receiving element 110 through a lens described later.

A light-blocking layer BM is provided on a surface of the substrate 152 that faces the substrate 151. The light-blocking layer BM has an opening in a position overlapping with the light-receiving element 110 and in a position overlapping with the light-emitting element 190. Providing the light-blocking layer BM can control the range where the light-receiving element 110 senses light.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, the light-receiving element 110 senses light that is emitted from the light-emitting element 190 and then reflected by an object. However, in some cases, light emitted from the light-emitting element 190 is reflected inside the display device 10A and enters the light-receiving element 110 without through an object. The light-blocking layer BM can reduce the influence of such stray light. For example, in the case where the light-blocking layer BM is not provided, light 23a emitted from the light-emitting element 190 is reflected by the substrate 152 and reflected light 23b enters the light-receiving element 110 in some cases. Providing the light-blocking layer BM can inhibit the reflected light 23b from entering the light-receiving element 110. Consequently, noise can be reduced, and the sensitivity of a sensor using the light-receiving element 110 can be increased.

In the light-emitting element 190, the common layer 112, the light-emitting layer 193, and the common layer 114, which are positioned between the pixel electrode 191 and the common electrode 115, can each also be referred to as an EL layer. The pixel electrode 191 preferably has a function of reflecting visible light. An end portion of the pixel electrode 191 is covered with the bank 216. The pixel electrode 111 and the pixel electrode 191 are electrically insulated from each other by the bank 216. The common electrode 115 has a function of transmitting visible light.

The light-emitting element 190 has a function of emitting visible light. Specifically, the light-emitting element 190 is an electroluminescent element that emits light to the substrate 152 side by applying voltage between the pixel electrode 191 and the common electrode 115 (see light emission 21).

It is preferable that the light-emitting layer 193 be formed not to overlap with a light-receiving region of the light-receiving element 110. This inhibits the light-emitting layer 193 from absorbing the light 29, increasing the amount of light with which the light-receiving element 110 is irradiated.

The pixel electrode 111 is electrically connected to a source or a drain of the transistor 41 through an opening provided in the insulating layer 214. The end portion of the pixel electrode 111 is covered with the bank 216.

The pixel electrode 191 is electrically connected to a source or a drain of the transistor 42 through an opening provided in the insulating layer 214. The end portion of the pixel electrode 191 is covered with the bank 216. The transistor 42 has a function of controlling the driving of the light-emitting element 190.

The transistor 41 and the transistor 42 are on and in contact with the same layer (the substrate 151 in FIG. 6A).

At least part of a circuit electrically connected to the light-receiving element 110 and a circuit electrically connected to the light-emitting element 190 are preferably formed using the same material in the same step. In that case, the thickness of the display device can be reduced compared with the case where the two circuits are separately formed, resulting in simplification of the manufacturing steps.

The light-receiving element 110 and the light-emitting element 190 are preferably covered with a protective layer 195. In FIG. 6A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are bonded to each other with an adhesive layer 142.

Figure 7A:
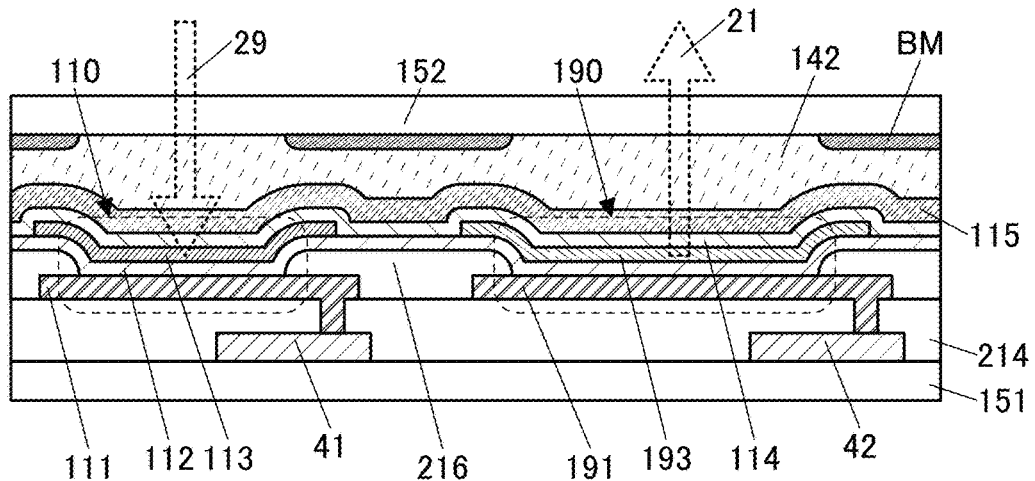
FIG. 7A, FIG. 7B, and FIG. 7C are each a cross-sectional view illustrating an example of a display device.

Note that as illustrated in FIG. 7A, the protective layer over the light-receiving element 110 and the light-emitting element 190 may be omitted. In FIG. 7A, the common electrode 115 and the substrate 152 are bonded to each other with the adhesive layer 142.

[Display Device 10B]

Figure 6B:
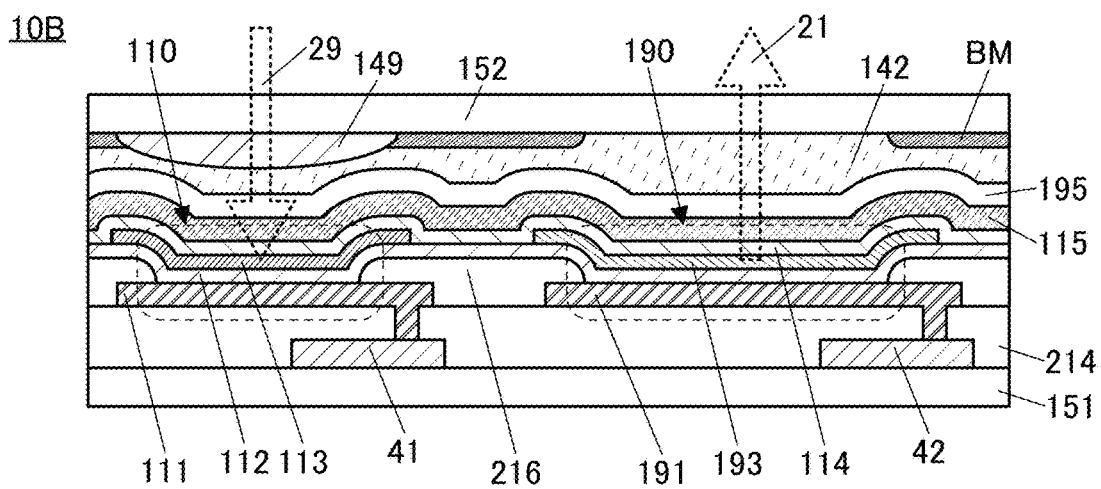

FIG. 6B is a cross-sectional view of a display device 10B. Note that in the description of the display device below, components similar to those of the above-mentioned display device are not described in some cases.

The display device 10B illustrated in FIG. 6B includes a lens 149 in addition to the components of the display device 10A.

The display device of this embodiment may include the lens 149. The lens 149 is provided in a position overlapping with the light-receiving element 110. In the display device 10B, the lens 149 is provided in contact with the substrate 152. The lens 149 included in the display device 10B has a convex surface on the substrate 151 side. Alternatively, the lens 149 may have a convex surface on the substrate 152 side.

In the case where the light-blocking layer BM and the lens 149 are formed on the same plane of the substrate 152, their formation order is not limited. FIG. 6B illustrates an example in which the lens 149 is formed first; alternatively, the light-blocking layer BM may be formed first. In FIG. 6B, an end portion of the lens 149 is covered with the light-blocking layer BM.

The display device 10B has a structure in which the light 29 enters the light-receiving element 110 through the lens 149. With the lens 149, the image-capturing range of the light-receiving element 110 can be narrowed as compared to the case where the lens 149 is not provided, thereby inhibiting overlap of the imaging ranges between the adjacent light-receiving elements 110. Thus, a clear image with little blurring can be captured. Given that the imaging range of the light-receiving element 110 does not change, the lens 149 allows the size of a pinhole (corresponding to the size of an opening in BM that overlaps with the light-receiving element 110 in FIG. 6B) to be increased, compared to the case where the lens 149 is not provided. Hence, providing the lens 149 can increase the amount of light entering the light-receiving element 110.

Figure 7B:
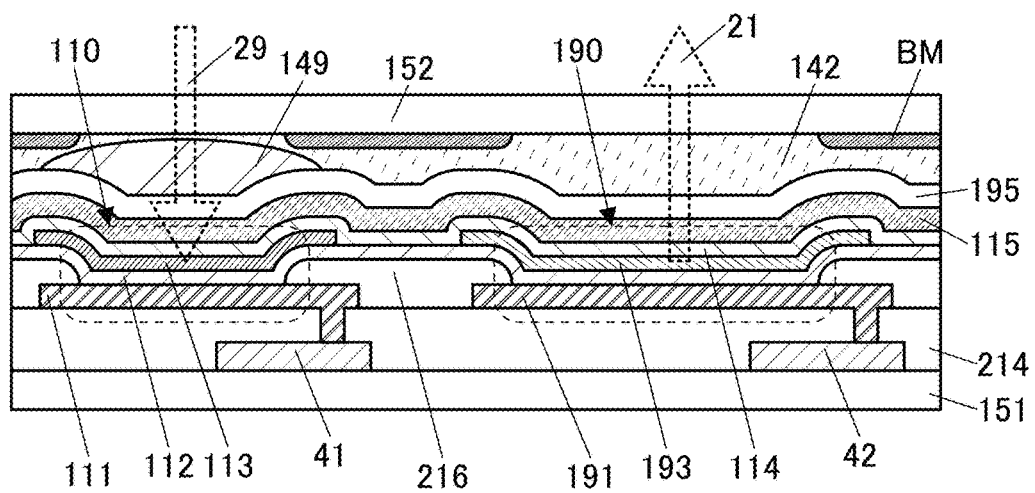
Figure 7C:
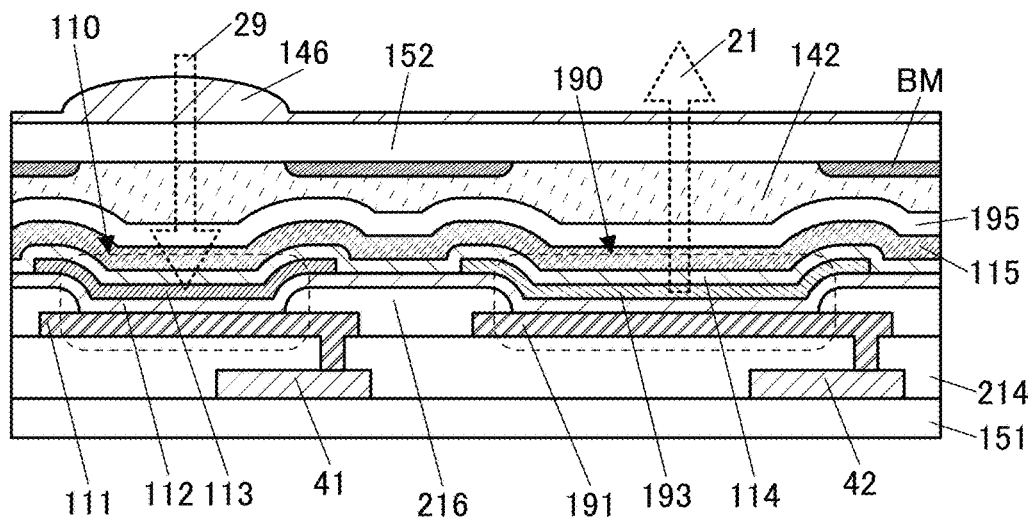

Each of display devices illustrated in FIG. 7B and FIG. 7C has a structure in which the light 29 enters the light-receiving element 110 through the lens 149, in a manner similar to that of the display device 10B illustrated in FIG. 6B.

In FIG. 7B, the lens 149 is provided in contact with a top surface of the protective layer 195. The lens 149 included in the display device illustrated in FIG. 7B has a convex surface facing the substrate 152.

In the display device illustrated in FIG. 7C, a lens array 146 is provided on the display surface side of the substrate 152. A lens included in the lens array 146 is provided in a position overlapping with the light-receiving element 110. The light-blocking layer BM is preferably provided on the surface of the substrate 152 on the substrate 151 side.

As a method for forming the lens used in the display device of this embodiment, a lens such as a microlens may be formed directly over the substrate or the light-receiving element, or a lens array formed separately, such as a microlens array, may be bonded to the substrate.

Figure 6C:
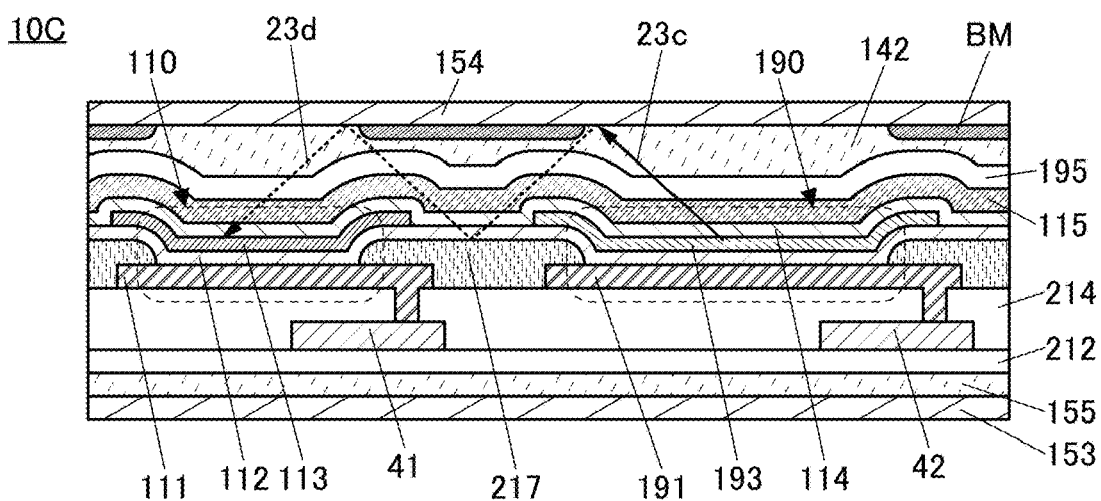

FIG. 6C shows a cross section of a display device 10C.

The display device 10C illustrated in FIG. 6C differs from the display device 10A in that the substrate 151, the substrate 152, and the bank 216 are not included and a substrate 153, a substrate 154, an adhesive layer 155, an insulating layer 212, and a bank 217 are included.

The substrate 153 and the insulating layer 212 are bonded to each other with the adhesive layer 155. The substrate 154 and the protective layer 195 are bonded to each other with the adhesive layer 142.

The display device 10C has a structure obtained in such a manner that the insulating layer 212, the transistor 41, the transistor 42, the light-receiving element 110, the light-emitting element 190, and the like are formed over a formation substrate and then transferred onto the substrate 153. The substrate 153 and the substrate 154 preferably have flexibility. Accordingly, the flexibility of the display device 10C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

The bank 217 preferably absorbs light emitted by the light-emitting element. As the bank 217, a black matrix can be formed using a resin material containing a pigment or dye, for example. Moreover, the bank 217 can be formed of a colored insulating layer by using a brown resist material.

In some cases, light 23c emitted from the light-emitting element 190 is reflected by the substrate 152 and the bank 217 and reflected light 23d enters the light-receiving element 110. In other cases, the light 23c passes through the bank 217 and is reflected by a transistor, a wiring, or the like, and thus reflected light enters the light-receiving element 110. When the bank 217 absorbs the light 23c, the reflected light 23d can be inhibited from entering the light-receiving element 110. Consequently, noise can be reduced, and the sensitivity of a sensor using the light-receiving element 110 can be increased.

The bank 217 preferably absorbs at least light with the wavelength that is sensed by the light-receiving element 110. For example, in the case where the light-receiving element 110 senses green light emitted from the light-emitting element 190, the bank 217 preferably absorbs at least green light. For example, when a red color filter is provided, the bank 217 can absorbs the green light 23c, and the reflected light 23d can be inhibited from entering the light-receiving element 110.

Figure 8A:
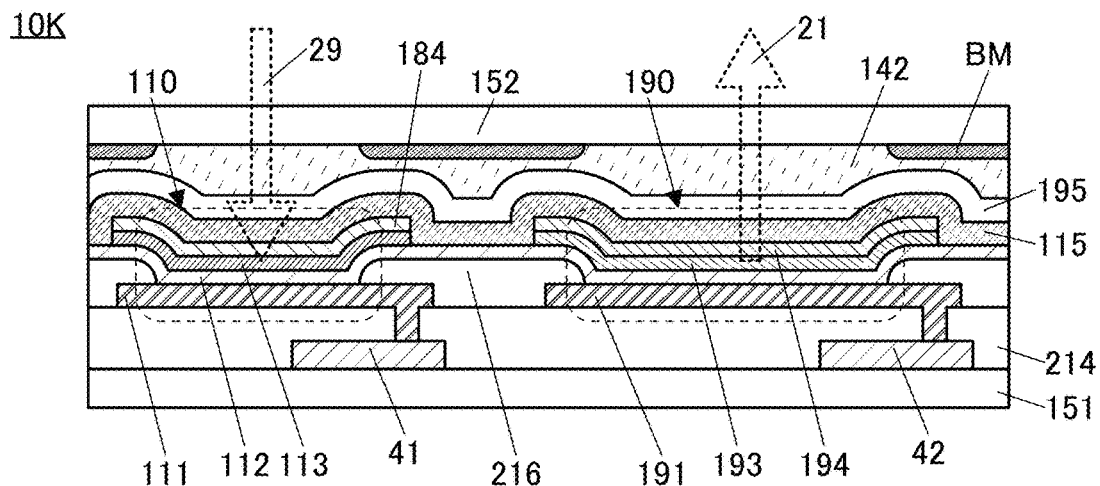
FIG. 8A, FIG. 8B, and FIG. 8C are each a cross-sectional view illustrating an example of a display device.
Figure 8B:
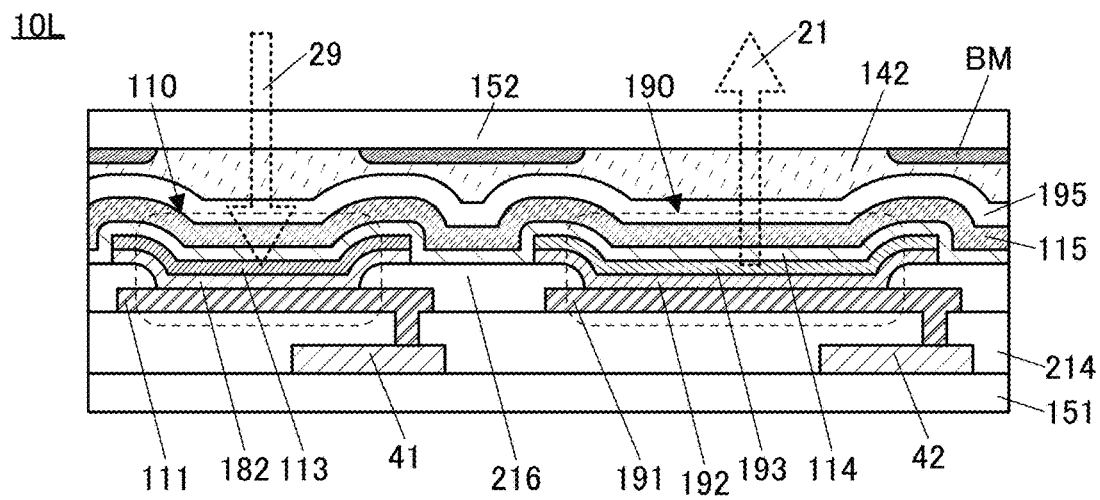
Figure 8C:
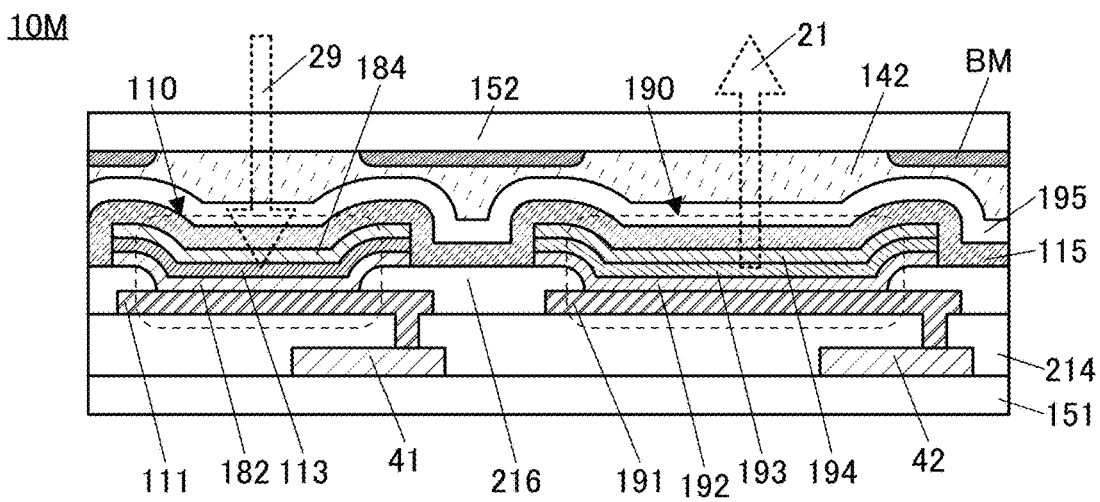

FIG. 8A shows a cross section of a display device 10K, FIG. 8B shows a cross section of a display device 10L, and FIG. 8C shows a cross section of a display device 10M.

The display device 10K differs from the display device 10A in that the common layer 114 is not included and a buffer layer 184 and a buffer layer 194 are included. The buffer layer 184 and the buffer layer 194 may each have a single-layer structure or a stacked-layer structure.

In the display device 10K, the light-receiving element 110 includes the pixel electrode 111, the common layer 112, the active layer 113, the buffer layer 184, and the common electrode 115. In the display device 10K, the light-emitting element 190 includes the pixel electrode 191, the common layer 112, the light-emitting layer 193, the buffer layer 194, and the common electrode 115.

The display device 10L differs from the display device 10A in that the common layer 112 is not included and a buffer layer 182 and a buffer layer 192 are included. The buffer layer 182 and the buffer layer 192 may each have a single-layer structure or a stacked-layer structure.

In the display device 10L, the light-receiving element 110 includes the pixel electrode 111, the buffer layer 182, the active layer 113, the common layer 114, and the common electrode 115. In the display device 10L, the light-emitting element 190 includes the pixel electrode 191, the buffer layer 192, the light-emitting layer 193, the common layer 114, and the common electrode 115.

The display device 10M differs from the display device 10A in that the common layer 112 and the common layer 114 are not included and the buffer layer 182, the buffer layer 184, the buffer layer 192, and the buffer layer 194 are included.

In the display device 10M, the light-receiving element 110 includes the pixel electrode 111, the buffer layer 182, the active layer 113, the buffer layer 184, and the common electrode 115. In the display device 10M, the light-emitting element 190 includes the pixel electrode 191, the buffer layer 192, the light-emitting layer 193, the buffer layer 194, and the common electrode 115.

In the formation of the light-receiving element 110 and the light-emitting element 190, not only the active layer 113 and the light-emitting layer 193 but also other layers can be formed separately.

In the display device 10K, an example is shown in which the buffer layer 184 between the common electrode 115 and the active layer 113 and the buffer layer 194 between the common electrode 115 and the light-emitting layer 193 are formed separately. As the buffer layer 194, one or both of an electron-injection layer and an electron-transport layer can be formed, for example.

In the display device 10L, an example is shown in which the buffer layer 182 between the pixel electrode 111 and the active layer 113 and the buffer layer 192 between the pixel electrode 191 and the light-emitting layer 193 are formed separately. As the buffer layer 192, one or both of a hole-injection layer and a hole-transport layer can be formed, for example.

In the display device 10M, an example is shown in which in each of the light-receiving element 110 and the light-emitting element 190, a common layer is not provided between the pair of electrodes (the pixel electrode 111 or the pixel electrode 191 and the common electrode 115). The light-receiving element 110 and the light-emitting element 190 included in the display device 10M can be manufactured in the following manner: the pixel electrode 111 and the pixel electrode 191 are formed over the insulating layer 214 using the same material in the same step; the buffer layer 182, the active layer 113, and the buffer layer 184 are formed over the pixel electrode 111; the buffer layer 192, the light-emitting layer 193, and the buffer layer 194 are formed over the pixel electrode 191; and then, the common electrode 115 is formed to cover the pixel electrode 111, the buffer layer 182, the active layer 113, the buffer layer 184, the pixel electrode 191, the buffer layer 192, the light-emitting layer 193, and the buffer layer 194. Note that the formation order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are deposited, the buffer layer 192, the light-emitting layer 193, and the buffer layer 194 may be formed. In contrast, the buffer layer 192, the light-emitting layer 193, and the buffer layer 194 may be formed before the buffer layer 182, the active layer 113, and the buffer layer 184 are deposited. Alternate deposition of the buffer layer 182, the buffer layer 192, the active layer 113, the light-emitting layer 193, and the like in this order is also possible.

Figure 9:
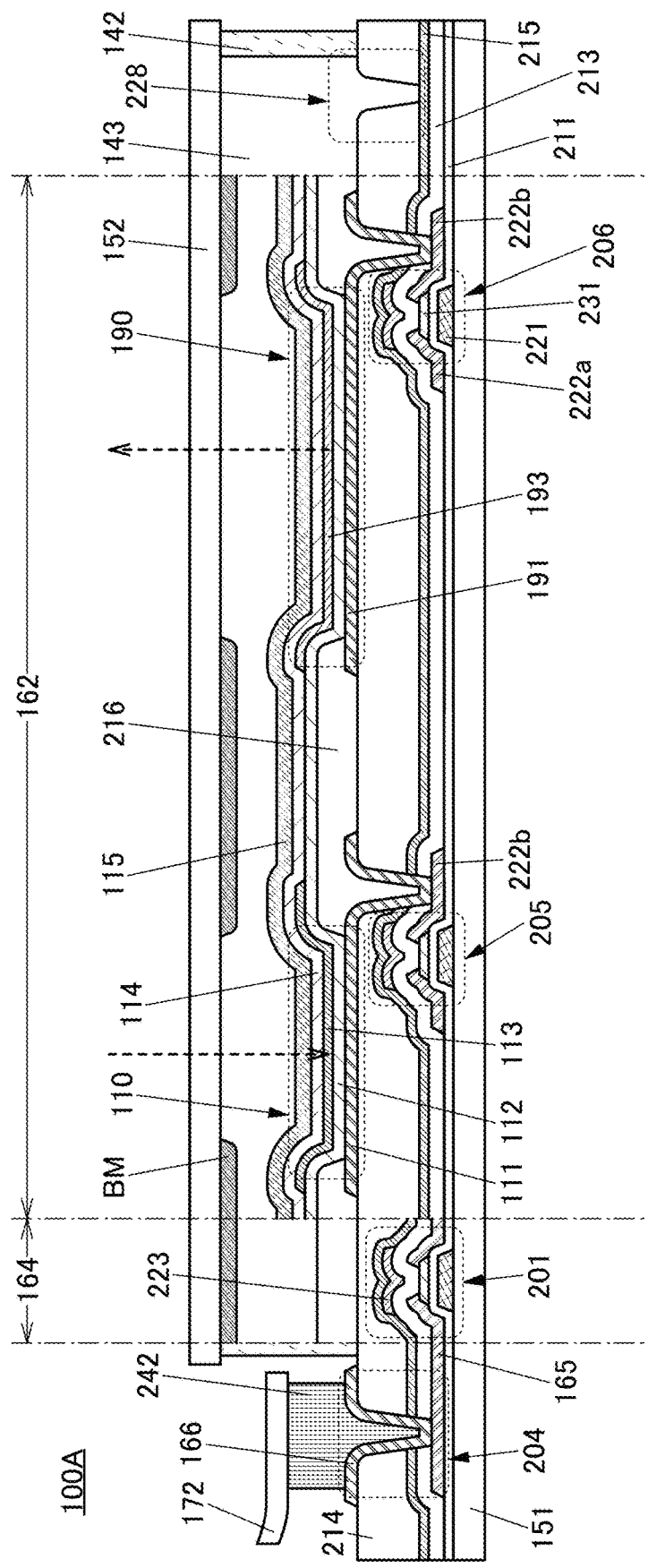
FIG. 9 is a cross-sectional view of an example of a display device.

A display device 100A illustrated in FIG. 9 includes a transistor 201, a transistor 205, a transistor 206, the light-emitting element 190, the light-receiving element 110, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190 and the light-receiving element 110. In FIG. 9, a space 143 surrounded by the substrate 152, the adhesive layer 142, and the insulating layer 214 is filled with an inert gas (e.g., nitrogen or argon), that is, a hollow sealing structure is employed. The adhesive layer 142 may be provided to overlap with the light-emitting element 190. The space 143 surrounded by the substrate 152, the adhesive layer 142, and the insulating layer 214 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214. The transistor 206 has a function of controlling the driving of the light-emitting element 190. The end portion of the pixel electrode 191 is covered with the bank 216. The pixel electrode 191 contains a material that reflects visible light, and the common electrode 115 contains a material that transmits visible light.

The light-receiving element 110 has a stacked-layer structure in which the pixel electrode 111, the common layer 112, the active layer 113, the common layer 114, and the common electrode 115 are stacked in this order from the insulating layer 214 side. The pixel electrode 111 is electrically connected to the conductive layer 222b included in the transistor 205 through an opening provided in the insulating layer 214. The end portion of the pixel electrode 111 is covered with the bank 216. The pixel electrode 111 contains a material that reflects visible light, and the common electrode 115 contains a material that transmits visible light.

Light emitted from the light-emitting element 190 is emitted toward the substrate 152 side. Light enters the light-receiving element 110 through the substrate 152 and the space 143. For the substrate 152, a material having a high visible-light-transmitting property is preferably used.

The pixel electrode 111 and the pixel electrode 191 can be formed using the same material in the same step. The common layer 112, the common layer 114, and the common electrode 115 are used in both the light-receiving element 110 and the light-emitting element 190. The light-receiving element 110 and the light-emitting element 190 can have common components except the active layer 113 and the light-emitting layer 193. Thus, the light-receiving element 110 can be incorporated into the display device 100A without a significant increase in the number of manufacturing steps.

A light-blocking layer BM is provided on a surface of the substrate 152 that faces the substrate 151. The light-blocking layer BM has an opening in a position overlapping with the light-receiving element 110 and in a position overlapping with the light-emitting element 190. Providing the light-blocking layer BM can control the range where the light-receiving element 110 senses light. Furthermore, with the light-blocking layer BM, light can be prevented from directly entering the light-receiving element 110 from the light-emitting element 190 without passing through any object. Hence, a sensor with less noise and high sensitivity can be obtained.

The transistor 201, the transistor 205, and the transistor 206 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water or hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side than the end portion of the display device 100A is, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 9, an opening is formed in the insulating layer 214. This can inhibit entry of impurities into a display portion 162 from the outside through the insulating layer 214 even when an organic insulating film is used as the insulating layer 214. Thus, the reliability of the display device 100A can be increased.

Each of the transistor 201, the transistor 205, and the transistor 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, and the transistor 206. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity other than single crystal is preferably used, in which case deterioration of the transistor characteristics can be suppressed.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target including a polycrystalline oxide is preferably used as the sputtering target, in which case the semiconductor layer having crystallinity is easily formed. Note that the atomic ratio in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is sometimes in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in a circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, resin, or the like can be used. When a flexible material is used for the substrate 151 and the substrate 152, the flexibility of the display device can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting element 190 may be of a top emission type, a bottom emission type, a dual emission type, or the like. A conductive film that transmits visible light is used as the electrode through which light is extracted. A conductive film that reflects visible light is preferably used as the electrode through which light is not extracted.

The light-emitting element 190 includes at least the light-emitting layer 193. The light-emitting element 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

The common layer 112, the light-emitting layer 193, and the common layer 114 may use either a low molecular compound or a high molecular compound and may also contain an inorganic compound. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 113 of the light-receiving element 110 includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 of the light-emitting element 190 and the active layer 113 of the light-receiving element 110 can be formed by the same method (e.g., a vacuum evaporation method) and thus the same manufacturing apparatus can be used.

Examples of an n-type semiconductor material included in the active layer 113 are electron-accepting organic semiconductor materials such as fullerene (e.g., $C_{60}$ and $C_{70}$) and derivatives thereof. As a p-type semiconductor material contained in the active layer 113, an electron-donating organic semiconductor material such as copper(II) phthalocyanine (CuPc) or tetraphenyldibenzoperiflanthene (DBP) can be given.

For example, the active layer 113 is preferably formed by co-evaporation of an n-type semiconductor and a p-type semiconductor.

As materials for a conductive layer such as a wiring or an electrode that forms a display device in addition to a gate, a source, and a drain of a transistor, metals such as aluminum, titanium, chromium, nickel, copper, yttrium, zirconium, molybdenum, silver, tantalum, and tungsten, or an alloy containing any of these metals as its main component can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

FIG. 10A shows a cross section of a display device 100B.

The display device 100B is different from the display device 100A mainly in that the lens 149 and the protective layer 195 are included.

Providing the protective layer 195 covering the light-receiving element 110 and the light-emitting element 190 can inhibit entry of impurities such as water into the light-receiving element 110 and the light-emitting element 190, so that the reliability of the light-receiving element 110 and the light-emitting element 190 can be increased.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display device 100B can be increased.

FIG. 10B illustrates an example in which the protective layer 195 has a three-layer structure. In FIG. 10B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, whereby the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 that faces the substrate 151. The lens 149 has a convex surface on the substrate 151 side. It is preferable that the light-receiving region of the light-receiving element 110 overlap with the lens 149 and not overlap with the light-emitting layer 193. Thus, the sensitivity and accuracy of a sensor using the light-receiving element 110 can be increased.

The lens 149 preferably has a refractive index greater than or equal to 1.3 and less than or equal to 2.5. The lens 149 can be formed using an inorganic material or an organic material. For example, a material containing a resin can be used for the lens 149. A material containing an oxide or a sulfide can be used for the lens 149.

Specifically, a resin containing chlorine, bromine, or iodine, a resin containing a heavy metal atom, a resin having an aromatic ring, a resin containing sulfur, or the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide or the like can be used for the lens 149.

In the display device 100B, the protective layer 195 and the substrate 152 are bonded to each other with the adhesive layer 142. The adhesive layer 142 is provided to overlap with the light-receiving element 110 and the light-emitting element 190; that is, the display device 100B employs a solid sealing structure.

FIG. 11A shows a cross section of a display device 100C.

The display device 100C differs from the display device 100B in transistor structures.

The display device 100C includes a transistor 208, a transistor 209, and a transistor 210 over the substrate 151.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting element 190 is electrically connected to one of the pair of low-resistance regions 231n of the transistor 208 through the conductive layer 222b.

The pixel electrode 111 of the light-receiving element 110 is electrically connected to the other of the pair of low-resistance regions 231n of the transistor 209 through the conductive layer 222b.

FIG. 11A illustrates an example in which the insulating layer 225 covers a top surface and a side surface of the semiconductor layer. Meanwhile, in FIG. 11B, the insulating layer 225 overlaps with the channel formation region 231i of the semiconductor layer 231 and does not overlap with the low-resistance regions 231n. The structure shown in FIG. 11B can be manufactured by processing the insulating layer 225 using the conductive layer 223 as a mask, for example. In FIG. 11B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

Figure 12:
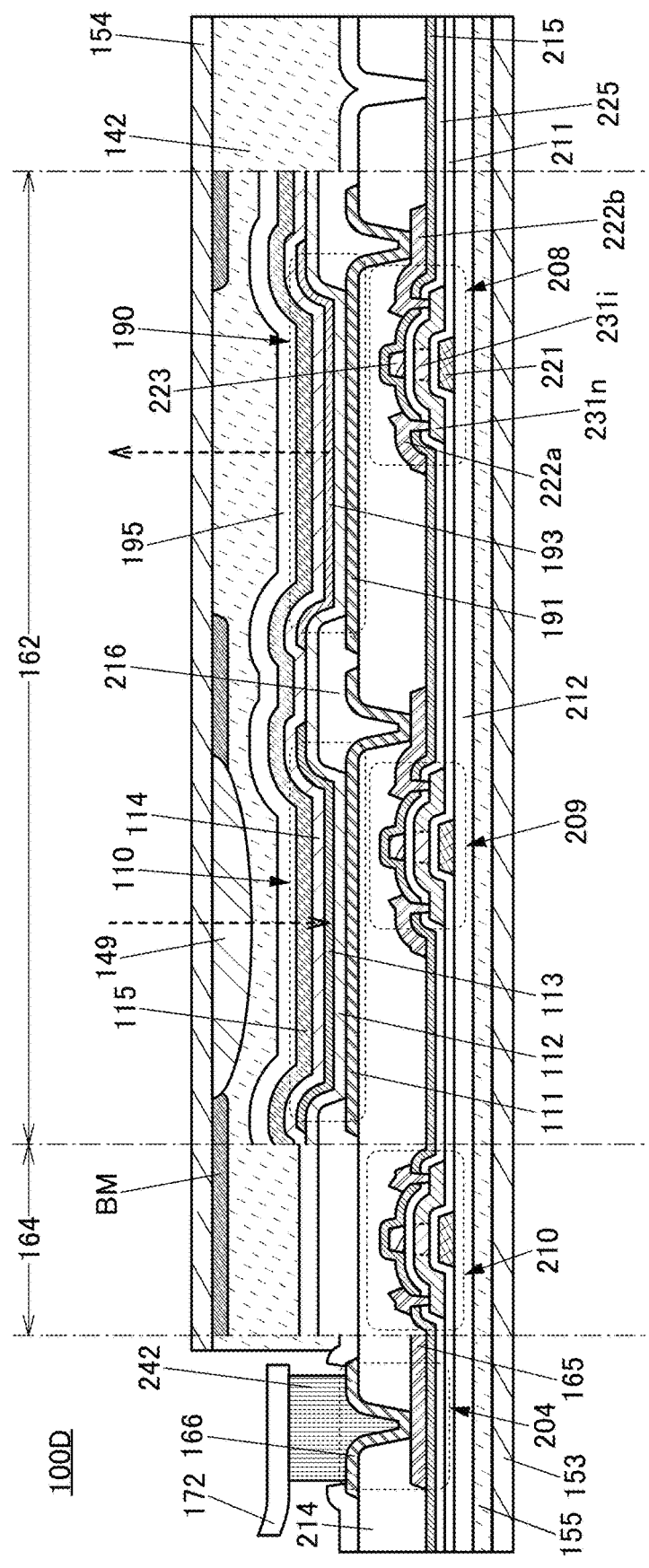
FIG. 12 is a cross-sectional view illustrating an example of a display device.

FIG. 12 shows a cross section of a display device 100D.

The display device 100D differs from the display device 100C mainly in that the substrate 151 and the substrate 152 are not included, the substrate 153, the substrate 154, the adhesive layer 155, and the insulating layer 212 are included, and the lens 149 is included.

The substrate 153 and the insulating layer 212 are bonded to each other with the adhesive layer 155. The substrate 154 and the protective layer 195 are bonded to each other with the adhesive layer 142.

The display device 100D has a structure obtained in such a manner that the insulating layer 212, the transistor 208, the transistor 209, the light-receiving element 110, the light-emitting element 190, and the like are formed over a formation substrate and then transferred onto the substrate 153. The substrate 153 and the substrate 154 preferably have flexibility. Accordingly, the flexibility of the display device 100D can be increased.

The inorganic insulating film that can be used as the insulating layer 211, the insulating layer 213, and the insulating layer 215 can be used as the insulating layer 212.

The display device 100C shows an example in which the lens 149 is not provided, and the display device 100D shows an example in which the lens 149 is provided. The lens 149 can be provided as appropriate in accordance with usage of a sensor or the like.

As described above, the display device of this embodiment includes a light-receiving element and a light-emitting element in a display portion, and the display portion has both a function of displaying an image and a function of sensing light. Thus, the size and weight of an electronic device can be reduced as compared to the case where a sensor is provided outside a display portion or outside a display device. Moreover, an electronic device having more functions can be achieved by a combination of the display device of this embodiment and a sensor provided outside the display portion or outside the display device.

In the light-receiving element, at least one of the layers other than the active layer can have a structure in common with a layer in the light-emitting element (EL element). Also in the light-receiving element, all of the layers other than the active layer can have structures in common with the layers in the light-emitting element (EL element). For example, the light-emitting element and the light-receiving element can be formed over one substrate only by adding a step of depositing the active layer in the manufacturing process of the light-emitting element. In the light-receiving element and the light-emitting element, their pixel electrodes can be formed using the same material in the same step, and their common electrodes can be formed using the same material in the same step. When a circuit electrically connected to the light-receiving element and a circuit electrically connected to the light-emitting element are formed using the same materials in the same steps, the manufacturing process of the display device can be simplified. In such a manner, a display device that incorporates a light-receiving element and is highly convenient can be manufactured without complicated steps.

The display device of this embodiment includes a coloring layer between the light-receiving element and the light-emitting element. A bank that electrically isolates the light-receiving element and the light-emitting element may also function as the colored layer. The coloring layer can absorb stray light in the display device, which increases the sensitivity of a sensor using the light-receiving element.

Figure 13A:
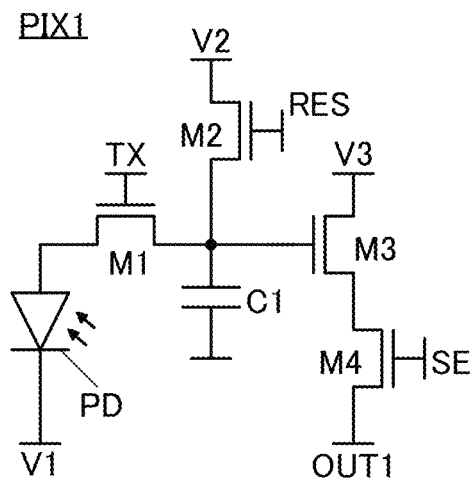
FIG. 13A and FIG. 13B are each a circuit diagram illustrating an example of a pixel circuit.
Figure 13B:
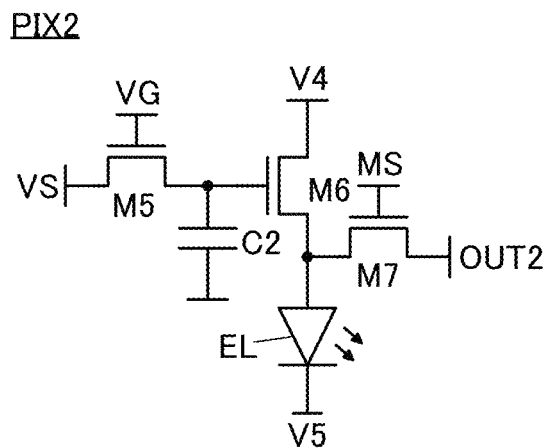

FIG. 13A illustrates an example of a first pixel circuit including a light-receiving element. FIG. 13B illustrates an example of a second pixel circuit including a light-emitting element.

A pixel circuit PIX1 illustrated in FIG. 13A includes a light-receiving element PD, a transistor M1, a transistor M2, a transistor M3, a transistor M4, and a capacitor C1. Here, an example in which a photodiode is used as the light-receiving element PD is illustrated.

A cathode of the light-receiving element PD is electrically connected to a wiring V1, and an anode thereof is electrically connected to one of a source and a drain of the transistor M1. A gate of the transistor M1 is electrically connected to a wiring TX, and the other of the source and the drain thereof is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1.

A constant potential is supplied to the wiring V1, the wiring V2, and the wiring V3. When the light-receiving element PD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 13B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain thereof is electrically connected to a wiring VS, and the other of the source and the drain thereof is electrically connected to one electrode of the capacitor C2 and a gate of the transistor M6. One of a source and a drain of the transistor M6 is electrically connected to a wiring V4, and the other thereof is electrically connected to an anode of the light-emitting element EL and one of a source and a drain of the transistor M7. A gate of the transistor M7 is electrically connected to a wiring MS, and the other of the source and the drain thereof is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL, in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Note that in the display device of this embodiment, the light-emitting element may be made to emit light in a pulsed manner so as to display an image. A reduction in the driving time of the light-emitting element can reduce the power consumption of the display device and suppress heat generation of the display device. An organic EL element is particularly preferable because of its favorable frequency characteristics. The frequency can be higher than or equal to 1 kHz and lower than or equal to 100 MHz, for example.

Here, a transistor using a metal oxide (an oxide semiconductor) in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charge accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 13A and FIG. 13B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided to overlap with the light-receiving element PD or the light-emitting element EL. Thus, the effective area of each pixel circuit can be reduced, and a high-resolution light-receiving portion or display portion can be achieved.

At least part of the configuration examples, the drawings corresponding thereto, and the like exemplified in this embodiment can be implemented in combination with the other configuration examples, the other drawings, and the like as appropriate.

At least part of this embodiment can be implemented in combination with the other embodiments described in this specification as appropriate.

Embodiment 3

In this embodiment, structures of transistors that can be used for the IC 20 described in the above embodiments will be described. As an example, a configuration in which transistors having different electrical characteristics are stacked is described. With the structure, the degree of freedom in design of the semiconductor device can be increased. Stacking transistors having different electrical characteristics can increase the degree of integration of the semiconductor device.

Figure 14:
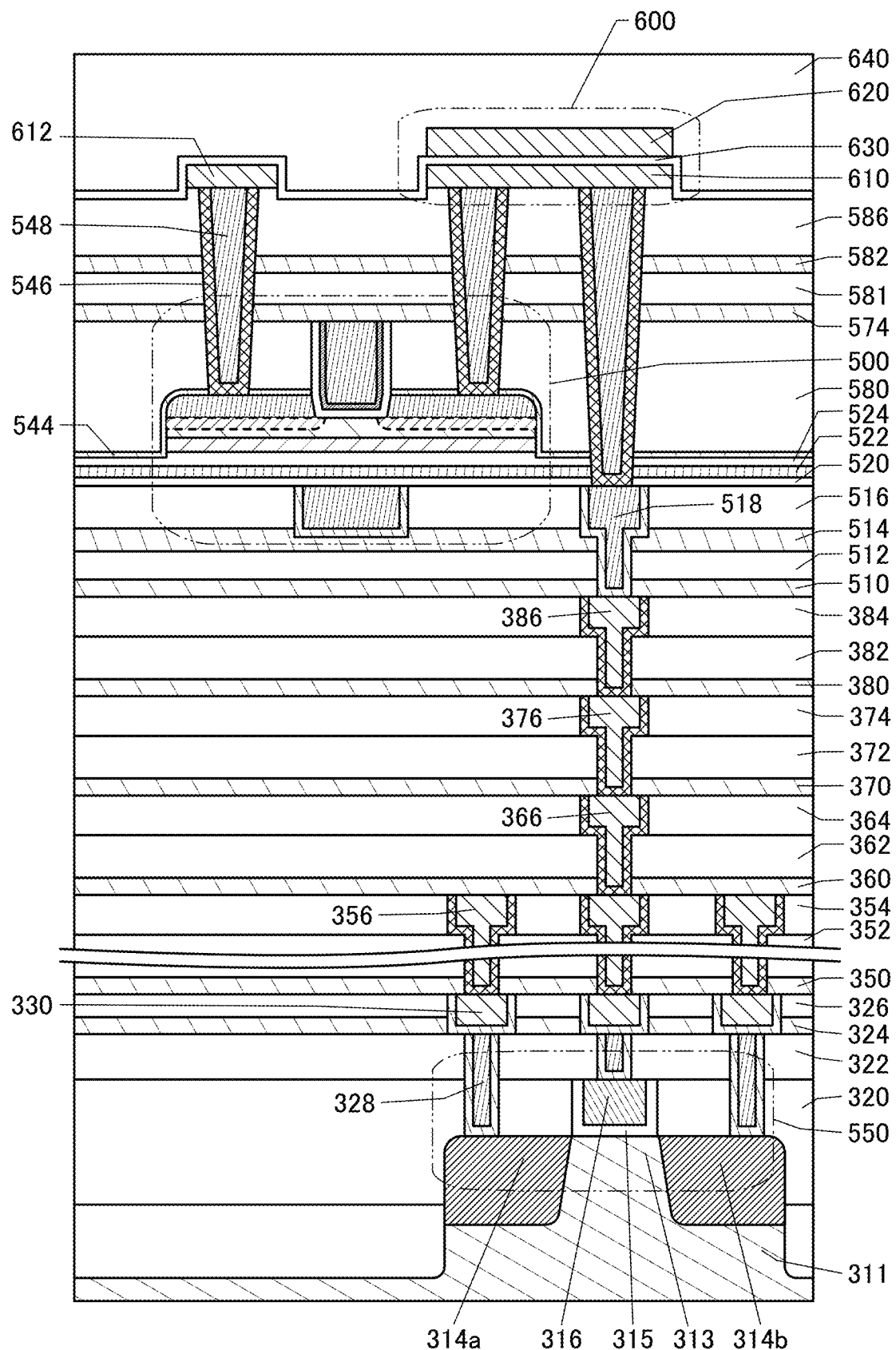
FIG. 14 is a diagram illustrating a structure example of a semiconductor device.
Figure 16A:
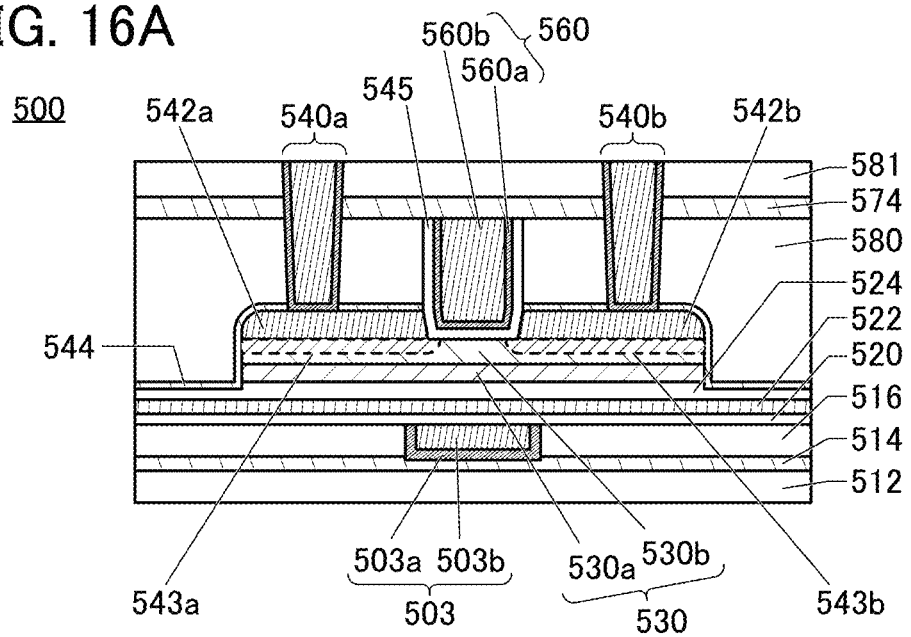
FIG. 16A to FIG. 16C are diagrams illustrating a transistor structure example.
Figure 16B:
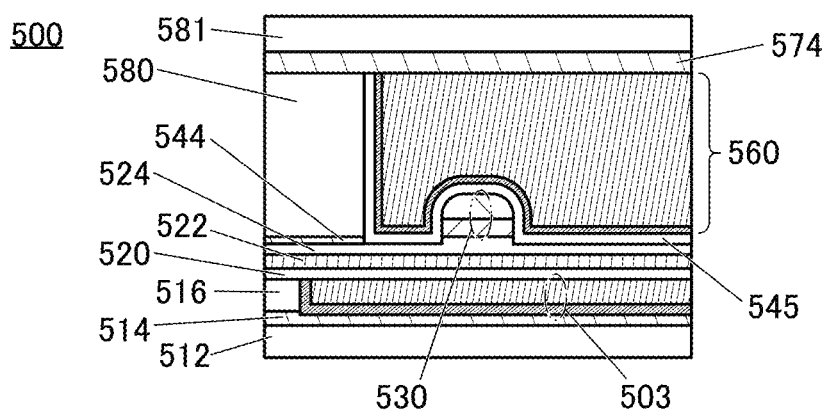
Figure 16C:
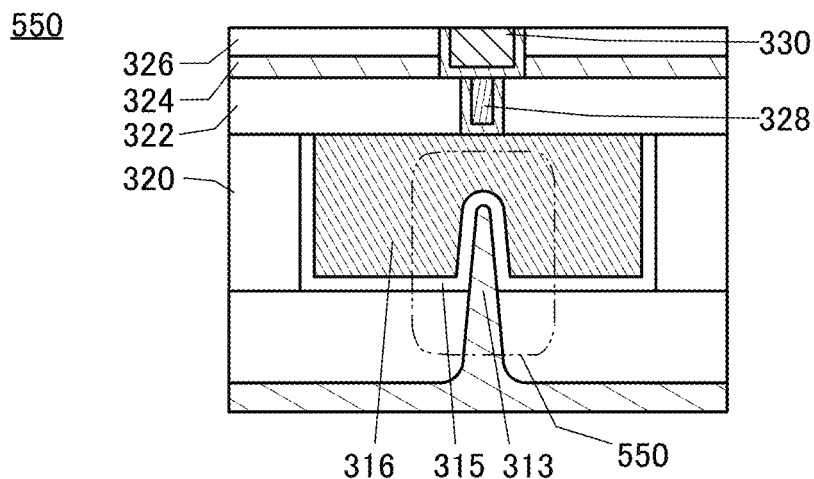

FIG. 14 shows part of a cross-sectional structure of a semiconductor device. A semiconductor device shown in FIG. 14 includes a transistor 550, a transistor 500, and a capacitor 600. FIG. 16A is a cross-sectional view of the transistor 500 in the channel length direction, FIG. 16B is a cross-sectional view of the transistor 500 in the channel width direction, and FIG. 16C is a cross-sectional view of the transistor 550 in the channel width direction.

The transistor 500 is an OS transistor. The transistor 500 has extremely low off-state current. Accordingly, data voltage or charge written to a storage node through the transistor 500 can be retained for a long time. In other words, power consumption of the semiconductor device can be reduced because a storage node has a low frequency of refresh operation or requires no refresh operation.

In FIG. 14, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region.

As shown in FIG. 16C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon.

Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using a silicon on insulator (SOI) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing; or an SOI substrate formed by using a Smart-Cut method in which a semiconductor substrate is cleaved by utilizing growth of a minute void, which is formed by implantation of a hydrogen ion, due to thermal treatment, by using a an ELTRAN method (a registered trademark: Epitaxial Layer Transfer), or the like. A transistor formed using a single crystal substrate contains a single crystal semiconductor in a channel formation region.

Figure 15:
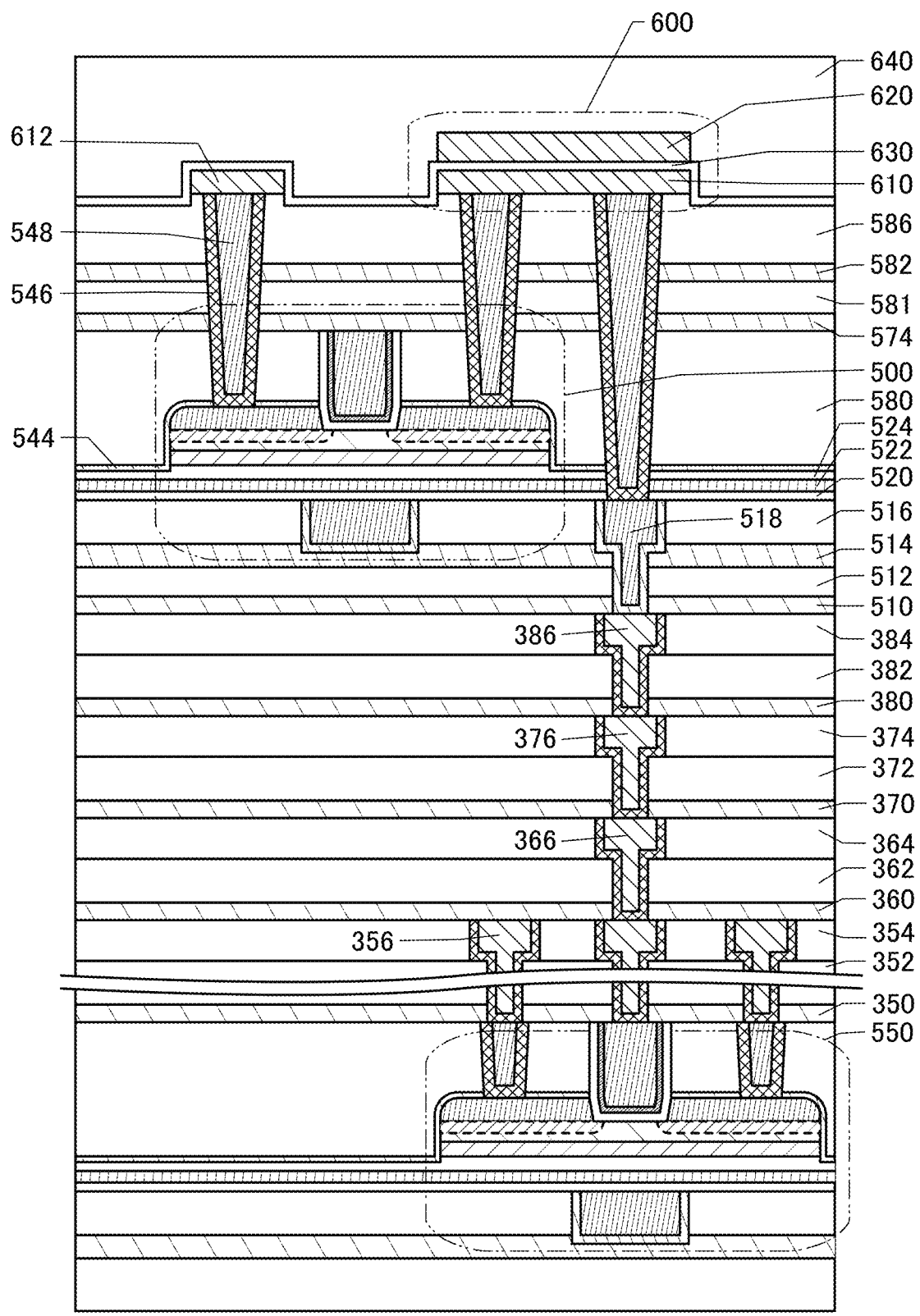
FIG. 15 is a diagram illustrating a structure example of a semiconductor device.

Note that the transistor 550 shown in FIG. 14 is an example and the configuration is not limited thereto; an appropriate transistor can be used in accordance with a circuit configuration or a driving method. In the case where all the transistors included in the semiconductor device are the OS transistors and have the same conductivity, which means the same-polarity transistors such as n-channel transistors only, for example, the transistor 550 has a structure similar to that of the transistor 500 as shown in FIG. 15. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 14, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a configuration in which a tantalum nitride layer having a barrier property against hydrogen is in contact with the insulator 350 having a barrier property against hydrogen is preferable.

A wiring layer may be provided over the insulator 354 and the conductor 356. For example, in FIG. 14, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 14, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 14, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Therefore, a material similar to that for the insulator 324 can be used.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen or moisture which are factors of change in electrical characteristics of the transistor. Accordingly, aluminum oxide can prevent mixing of impurities such as hydrogen or moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As shown in FIG. 16A and FIG. 16B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of an opening; and a conductor 560 positioned on a formation surface of the insulator 545.

In addition, as shown in FIG. 16A and FIG. 16B, an insulator 544 is preferably positioned between the insulator 580 and the oxide 530a, the oxide 530b, the conductor 542a, and the conductor 542b. Furthermore, as illustrated in FIG. 16A and FIG. 16B, the conductor 560 preferably includes a conductor 560a provided on an inner side than the insulator 545 and a conductor 560b provided to be embedded on the inner side of the conductor 560a. Moreover, as shown in FIG. 16A and FIG. 16B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is shown, the present invention is not limited thereto. For example, it is possible to employ a structure in which a single layer of the oxide 530b or a stacked-layer structure of three or more layers is provided.

Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistors 500 shown in FIG. 14, FIG. 15, and FIG. 16A are examples, and the structures are not limited thereto; an appropriate transistor can be used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_O H$ is sufficiently reduced. When an oxide semiconductor with sufficiently reduced impurities such as $V_O H$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^{-3}$, preferably greater than or equal to $1.0 \times 10^{19}$ atoms/cm$^{-3}$, further preferably greater than or equal to $2.0 \times 10^{19}$ atoms/cm$^{-3}$ or greater than or equal to $3.0 \times 10^{20}$ atoms/cm$^{-3}$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of $V_O H \rightarrow V_O + H$ occurs. Part of hydrogen generated at this time is bonded to oxygen to be $H_2 O$, and removed from the oxide 530 or an insulator near the oxide 530 in some cases. Some hydrogen may be gettered into the conductor 542 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O + O \rightarrow$null. Furthermore, hydrogen remaining in the oxide 530 reacts with supplied oxygen, so that the hydrogen can be removed as $H_2 O$ (dehydration). This can inhibit recombination of hydrogen remaining in the oxide 530 with oxygen vacancies and formation of $V_O H$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIG. 16A and FIG. 16B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, tin, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap that is preferably 2 eV or higher, further preferably 2.5 eV or higher. With use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion between the oxide 530a and the oxide 530b. In other words, the energy level of the conduction band minimum at the junction portion between the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 16A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as shown in FIG. 16A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is shown in FIG. 16A and FIG. 16B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen or moisture which are factors of change in electrical characteristics of the transistor. Accordingly, aluminum oxide can prevent mixing of impurities such as hydrogen or moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor

500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, paper, and the like. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 17A:
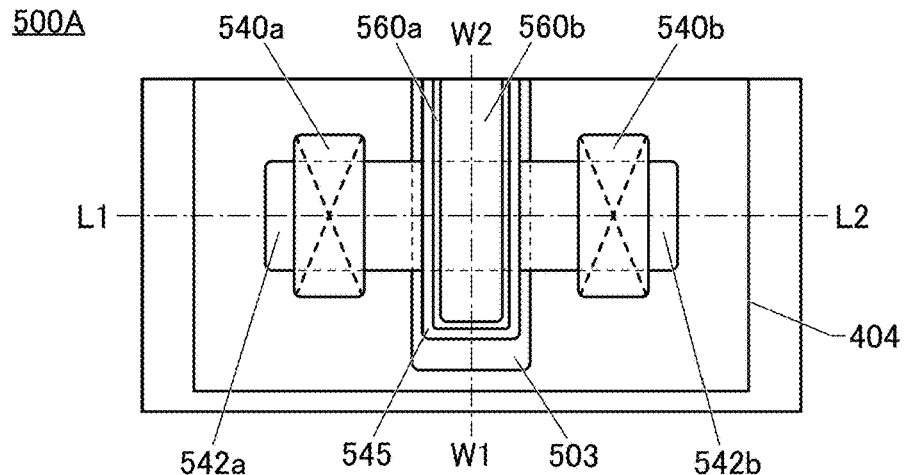
FIG. 17A to FIG. 17C are diagrams illustrating a transistor structure example.
Figure 17B:
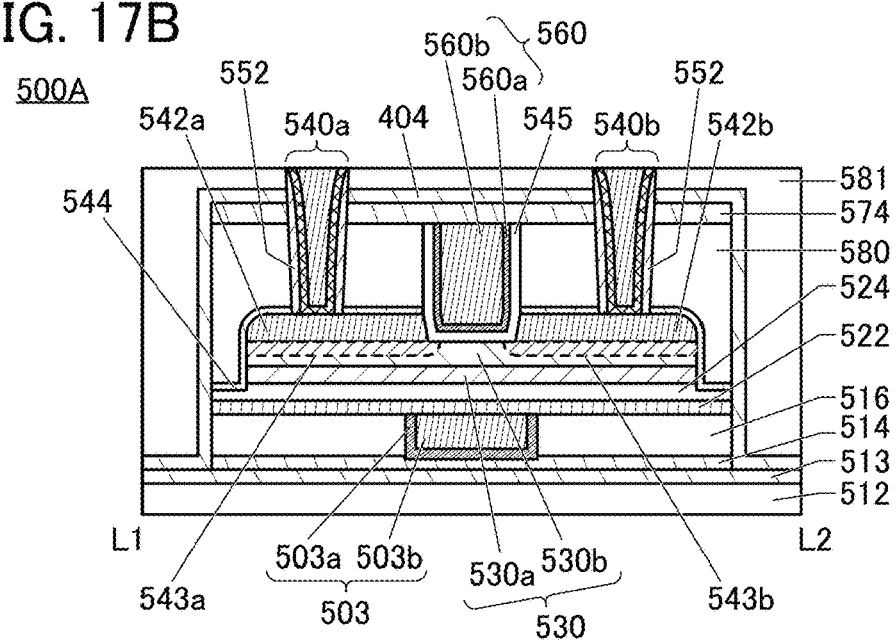
Figure 17C:
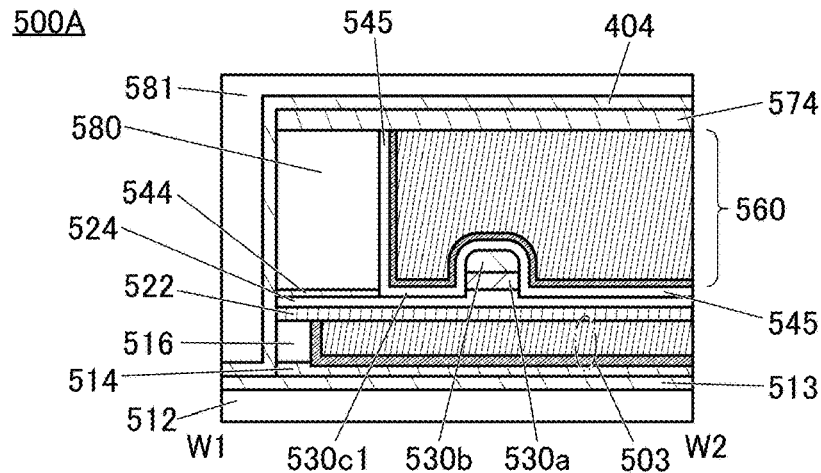

A transistor 500A shown in FIG. 17A, FIG. 17B, and FIG. 17C is a modification example of the transistor 500 having the structure shown in FIG. 16A and FIG. 16B. FIG. 17A is a top view of the transistor 500A, FIG. 17B is a cross-sectional view of the transistor 500A in the channel length direction, and FIG. 17C is a cross-sectional view of the transistor 500A in the channel width direction. Note that for clarity of the drawing, some components are not shown in the top view of FIG. 17A. The structure shown in FIG. 17A, FIG. 17B, and FIG. 17C can also be used for other transistors such as the transistor 550 included in the semiconductor device of one embodiment of the present invention.

The transistor 500A having the structure illustrated in FIG. 17A, FIG. 17B, and FIG. 17C is different from the transistor 500 having the structure illustrated in FIG. 16A and FIG. 16B in that an insulator 552, an insulator 513, and an insulator 404 are included. Furthermore, the transistor 500A is different from the transistor 500 having the structure shown in FIG. 16A and FIG. 16B in that the insulator 552 is provided in contact with a side surface of the conductor 540a and a side surface of the conductor 540b. Moreover, the transistor 500A is different from the transistor 500 having the structure shown in FIG. 16A and FIG. 16B in that the insulator 520 is not included.

In the transistor 500A having the structure shown in FIG. 17A, FIG. 17B, and FIG. 17C, the insulator 513 is provided over the insulator 512. The insulator 404 is provided over the insulator 574 and the insulator 513.

In the transistor 500A having the structure shown in FIG. 17A, FIG. 17B, and FIG. 17C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Modification Example 2 of Transistor

Figure 18A:
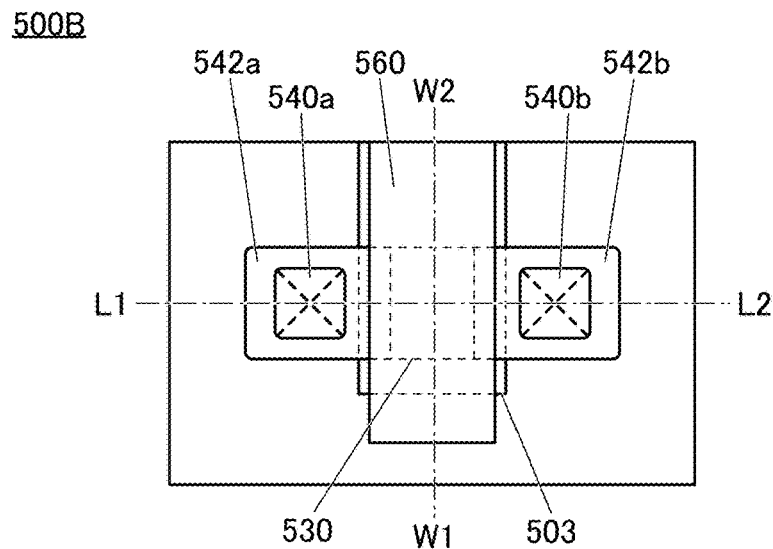
FIG. 18A to FIG. 18C are diagrams illustrating a transistor structure example.
Figure 18B:
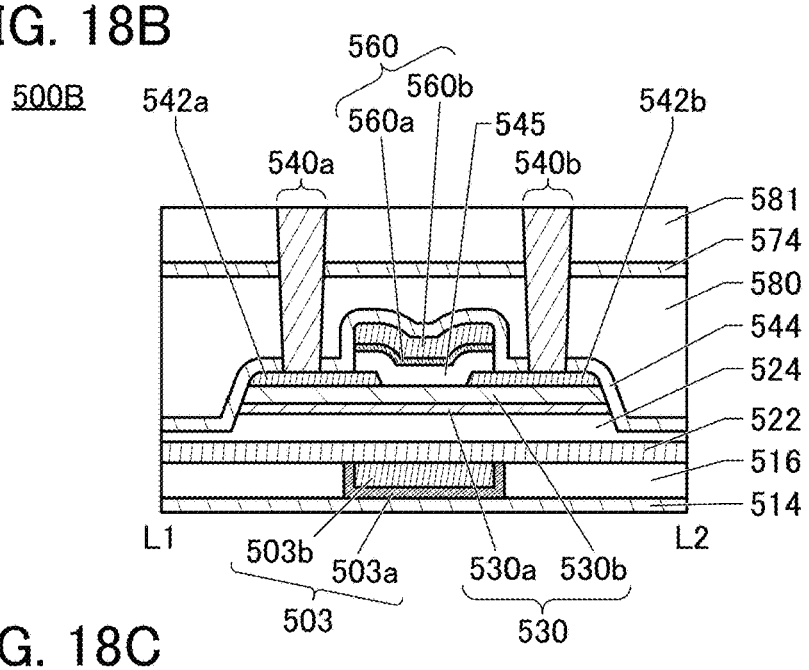
Figure 18C:
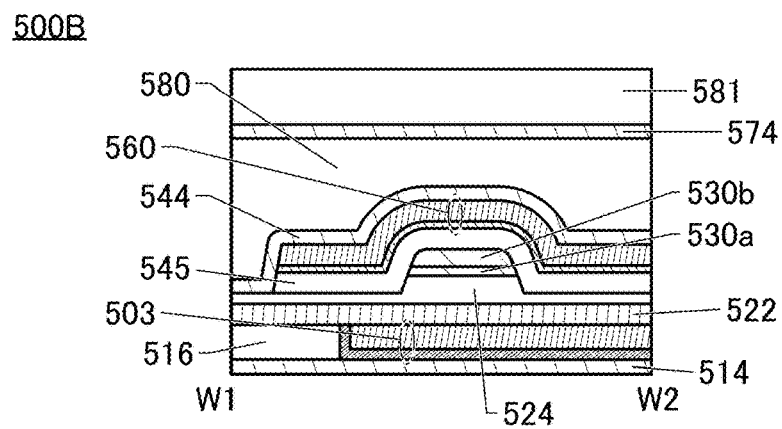

A structure example of a transistor 500B is described with reference to FIG. 18A, FIG. 18B, and FIG. 18C. FIG. 18A is a top view of the transistor 500B. FIG. 18B is a cross-sectional view of a portion indicated by dashed-dotted line L1-L2 in FIG. 18A. FIG. 18C is a cross-sectional view of a portion indicated by a dashed-dotted line W1-W2 in FIG. 18A. Note that for clarity of the drawing, some components are not shown in the top view of FIG. 18A.

The transistor 500B is a modification example of the transistor 500 and can be replaced with the transistor 500. Thus, differences of the transistor 500B from the transistor 500 will be mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing the decrease in conductivity.

The insulator 544 is preferably provided to cover the top surface and the side surface of the conductor 560 and a side surface of the insulator 545. For the insulator 544, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping with part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described above in this embodiment can be used in combination as appropriate with the compositions, structures, methods, and the like described in the other embodiments, the example, and the like.

Embodiment 4

In this embodiment, an oxide semiconductor which is a kind of metal oxides will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classifications of the crystal structures of an oxide semiconductor will be described with reference to FIG. 19A. FIG. 19A is a diagram showing the classification of crystal structures of an oxide semiconductor, typically IGZO (a metal oxide containing In, Ga, and Zn).

As shown in FIG. 19A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 19A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 19B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 19B and obtained by GIXD measurement is hereinafter simply referred to as an XRD spectrum. The vertical axis and the horizontal axis in FIG. 19B represent intensity and 2θ The CAAC-IGZO film in FIG. 19B has a composition in the vicinity of In:Ga:Zn=4:2:3 [atomic ratio]. The CAAC-IGZO film in FIG. 19B has a thickness of 500 nm.

As shown in FIG. 19B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 19B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 19C shows a diffraction pattern of the CAAC-IGZO film. FIG. 19C shows a diffraction pattern obtained with the NBED method in which an electron beam is incident in the direction parallel to the substrate. The composition of the CAAC-IGZO film in FIG. 19C is In:Ga:Zn=4:2:3 [atomic ratio] or the neighborhood thereof. In the nanobeam electron diffraction method, electron diffraction is performed with a probe diameter of 1 nm.

As shown in FIG. 19C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 19A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process. [nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).
[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.
<<Structure of Oxide Semiconductor>>

Next, the above-described CAC-OS is described in detail. Note that the CAC-OS relates to the material composition.
[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^{-3}$, preferably lower than or equal to $2\times10^{17}$ atoms/cm$^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^{-3}$, preferably lower than or equal to $2\times10^{16}$ atoms/cm$^{-3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for the channel formation region of the transistor, stable electrical characteristics can be given.

The composition, structure, method, and the like described above in this embodiment can be used in combination as appropriate with the compositions, structures, methods, and the like described in the other embodiments and the example.

Embodiment 5

In this embodiment, electronic devices of one embodiment of the present invention will be described with reference to FIG. 20, FIG. 21, and FIG. 22.

An electronic device in this embodiment includes a display device of one embodiment of the present invention. For example, the display device of one embodiment of the present invention can be used in a display portion of the electronic device. The display device of one embodiment of the present invention has a function of sensing light, and thus can perform biometric authentication on the display portion or sense a touch or a near touch on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
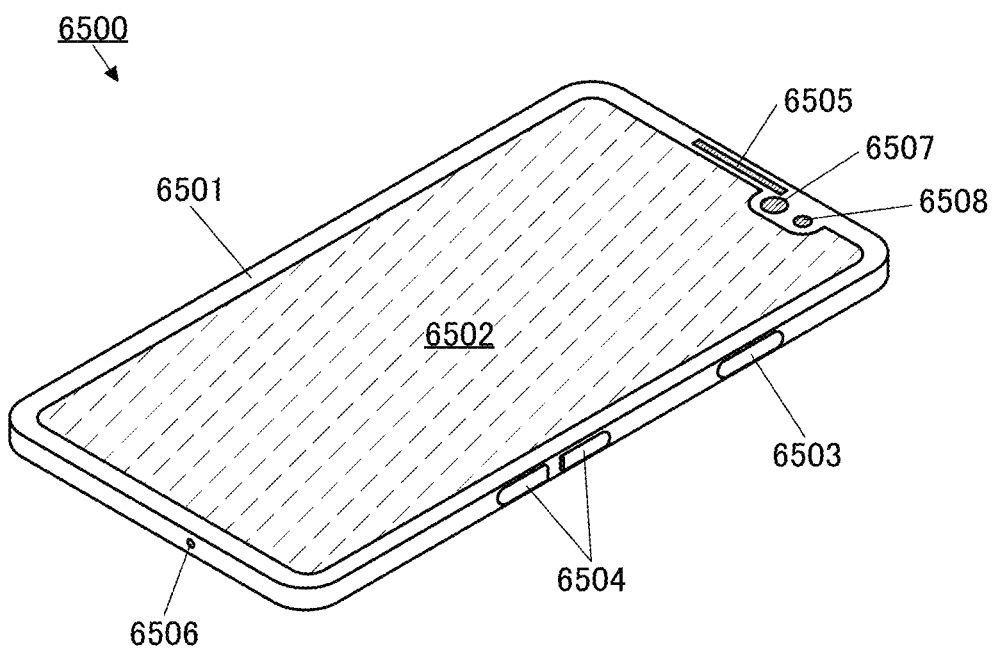
FIG. 20A is a perspective view illustrating an example of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 20B:
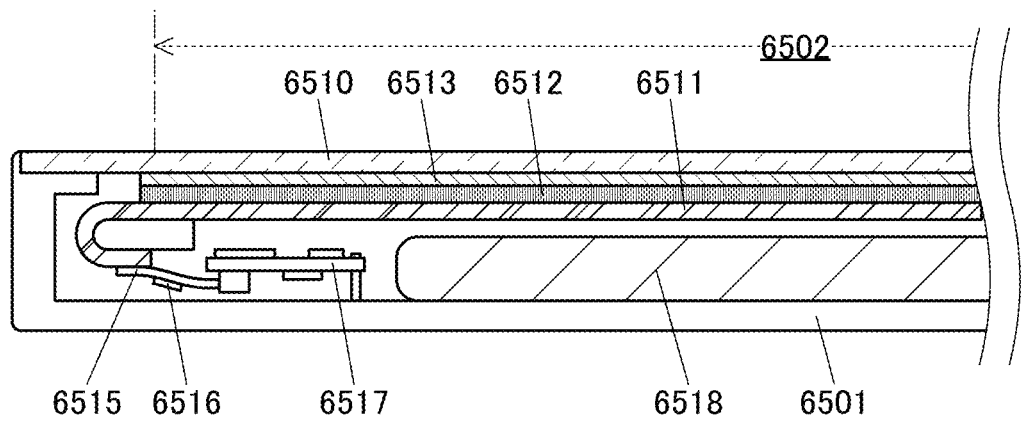
FIG. 20B is a cross-sectional view thereof.

FIG. 20B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Figure 21A:
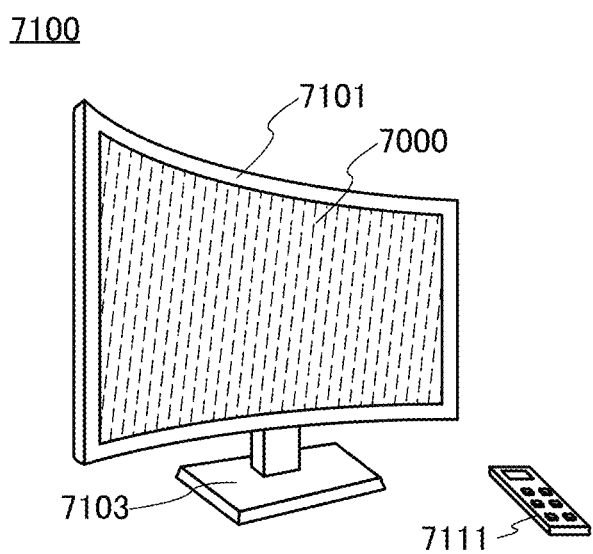
FIG. 21A, FIG. 21B, FIG. 21C, and FIG. 21D are drawings each illustrating an example of an electronic device.

FIG. 21A illustrates an example of a television device. In a television device 7100, a display portion 7000 is incorporated in a housing 7101. Here, a structure in which the housing 7101 is supported by a stand 7103 is illustrated.

A display device of one embodiment of the present invention can be used in the display portion 7000.

Operation of the television device 7100 illustrated in FIG. 21A can be performed with an operation switch provided in the housing 7101 or a remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 21B:
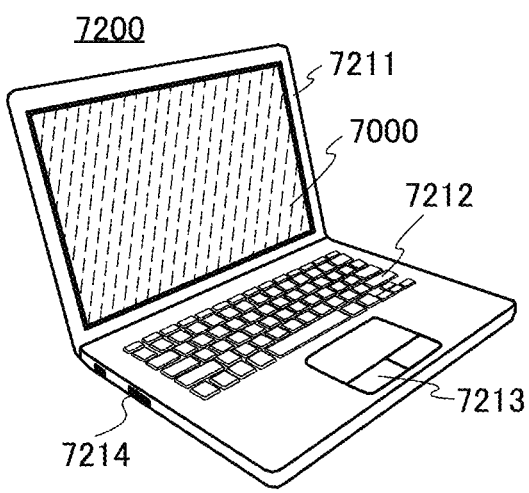

FIG. 21B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

A display device of one embodiment of the present invention can be used in the display portion 7000.

Figure 21C:
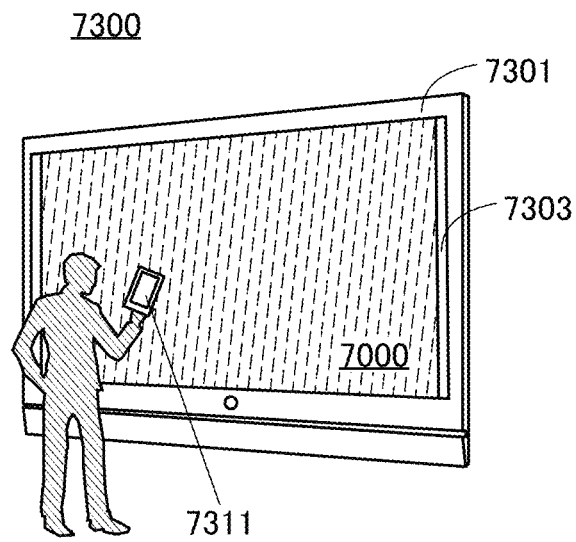
Figure 21D:
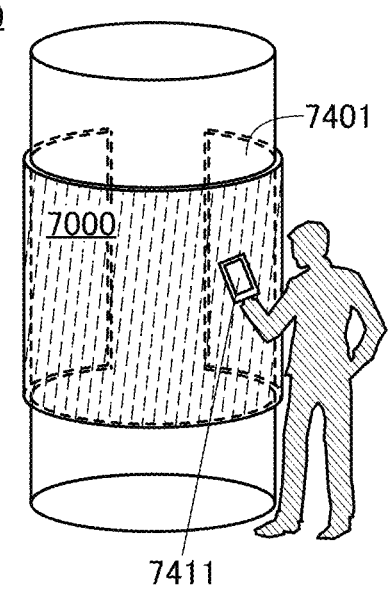

FIG. 21C and FIG. 21D illustrate examples of digital signage.

Digital signage 7300 illustrated in FIG. 21C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 21D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 21C and FIG. 21D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 21C and FIG. 21D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 22A to FIG. 22F include a housing 9000, a display portion 9001, a speaker 9003, an operation key 9005 (including a power switch or an operation switch), a connection terminal 9006, a sensor 9007

(a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 22A to FIG. 22F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 22A to FIG. 22F are described below.

Figure 22A:
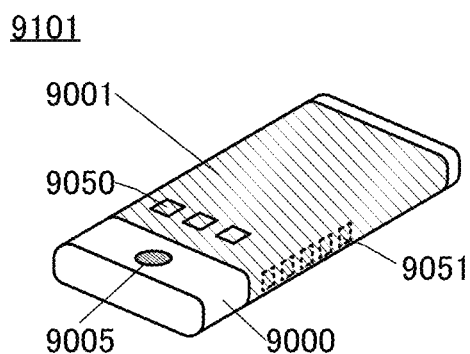
FIG. 22A, FIG. 22B, FIG. 22C, FIG. 22D, FIG. 22E, and FIG. 22F are drawings each illustrating an example of an electronic device.

FIG. 22A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 22A shows an example in which three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 22B:
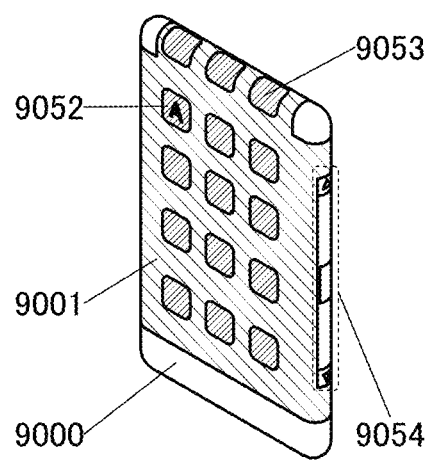

FIG. 22B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 22C:
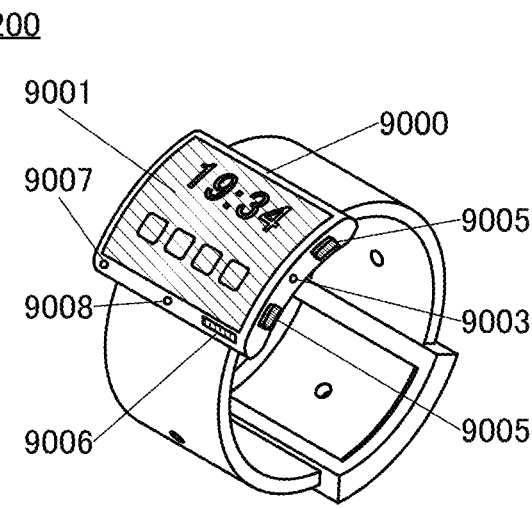

FIG. 22C is a perspective view illustrating a watch-type portable information terminal 9200. The portable information terminal 9200 can be used as a smartwatch (registered trademark), for example. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 22D:
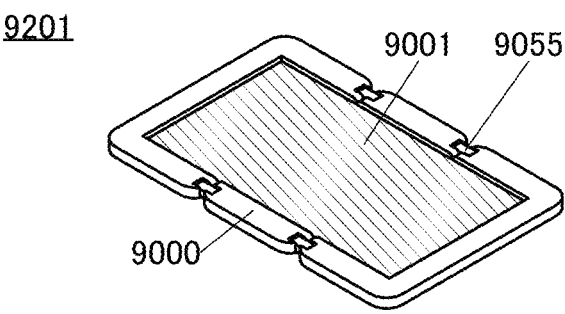
Figure 22E:
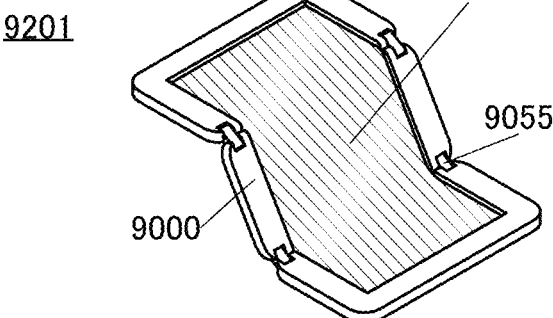
Figure 22F:
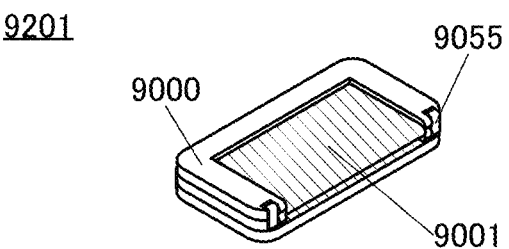

FIG. 22D, FIG. 22E, and FIG. 22F are perspective views illustrating a foldable portable information terminal 9201. FIG. 22D is a perspective view of an opened state of the portable information terminal 9201, FIG. 22F is a perspective view of a folded state thereof, and FIG. 22E is a perspective view of a state in the middle of change from one of FIG. 22D and FIG. 22F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of the configuration examples, the drawings corresponding thereto, and the like exemplified in this embodiment can be implemented in combination with the other configuration examples, the other drawings, and the like as appropriate.

At least part of this embodiment can be implemented in combination with the other embodiments described in this specification as appropriate.

REFERENCE NUMERALS

10: display device, 10A: display device, 10B: display device, 10C: display device, 10K: display device, 10L: display device, 10M: display device, 11: display portion, 12: pixel, 13: scan line driver circuit, 13L: IC column, 13R: IC column, 14: optical sensor portion, 15: demultiplexer, 16: host, 18: substrate, 19: FPC, 20: IC, 20_m: IC, 20_1: IC, 20_2: IC, 20_3: IC, 21: light emission, 21_m: circuit, 21_1: circuit, 21_2: circuit, 22: signal line driver circuit, 22m: signal line driver circuit, 22_1: signal line driver circuit, 22_2: signal line driver circuit, 23: driver circuit, 23a: light, 23b: reflected light, 23c: light, 23d: reflected light, 24: detection circuit, 25: image processing circuit, 25m: image processing circuit, 25_1: image processing circuit, 26: RAM, 26_m: RAM, 26_1: RAM, 27: CPU, 28: timing controller, 29: light, 41: transistor, 42: transistor, 50A: display device, 50B: display device, 51: substrate, 52: finger, 53: layer, 55: layer, 57: layer, 59: substrate, 70: substrate, 71: coloring film, 72: conductive film, 73: EL element, 74: conductive film, 75: EL layer, 76: conductive film, 77: light-blocking film, 78: insulating film, 79: conductive film, 79a: conductive film, 79b: conductive film, 80: conductive film, 81: conductive film, 84: conductive film, 85: conductive film, 87: insulating film, 100A: display device, 100B: display device, 100C: display device, 100D: display device, 110: light-receiving element, 111: pixel electrode, 112: common layer, 113: active layer, 114: common layer, 115: common electrode, 142: adhesive layer, 143: space, 146: lens array, 149: lens, 151: substrate, 152: substrate, 153: substrate, 154: substrate, 155: adhesive layer, 162: display portion, 164: circuit, 165: wiring, 166: conductive layer, 172: FPC, 182: buffer layer, 184: buffer layer, 190: light-emitting element, 191: pixel electrode, 192: buffer layer, 193: light-emitting layer, 194: buffer layer, 195: protective layer, 195a: inorganic insulating layer, 195b: organic insulating layer, 195c:

inorganic insulating layer, 201: transistor, 204: connection portion, 205: transistor, 206: transistor, 208: transistor, 209: transistor, 210: transistor, 211: insulating layer, 212: insulating layer, 213: insulating layer, 214: insulating layer, 215: insulating layer, 216: bank, 217: bank, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 242: connection layer, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 526: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A semiconductor device comprising:
a first substrate provided with a display portion;
at least one chip comprising a semiconductor integrated circuit; and
a second substrate overlapping with the display portion,
wherein the display portion comprises a pixel,
wherein the pixel comprises a first light-emitting element, a second light-emitting element, a third light-emitting element and an optical sensor element in matrix,
wherein each of the first light-emitting element, the second light-emitting element, and the third light-emitting element has a different emission color from each other,
wherein the first light-emitting element comprises a first electrode, a common layer over the first electrode, a light-emitting layer over the common layer, and a second electrode over the light-emitting layer,
wherein the optical sensor element comprises a third electrode, the common layer over the third electrode, an active layer over the common layer, and a fourth electrode over the active layer,
wherein the optical sensor element is configured to receive light emitted from the first light-emitting element, the second light-emitting element, and the third light-emitting element,
wherein the display portion is configured to display an image and to capture an image of an object overlapping with the display portion by detection using reflected light of emitted light from the first light-emitting element, the second light-emitting element, and the third light-emitting element,
wherein the chip is mounted on one surface of the first substrate,
wherein the first substrate and the second substrate are fixed so that the one surface of the first substrate and one surface of the second substrate face each other,
wherein the chip comprises a detection circuit of the optical sensor element, an image processing circuit, a driver circuit of the optical sensor element, and a driver circuit of the first light-emitting element, the second light-emitting element, and the third light-emitting element,
wherein the detection circuit of the optical sensor element is configured to detect a near touch$_{[DH1][JH2]}$, and
wherein the detection circuit of the optical sensor element is further configured to output an output signal from the optical sensor element to the image processing circuit by converting an analog signal output from the optical sensor element into a digital signal.

2. The semiconductor device according to claim 1, wherein the display portion comprises a pixel electrode and a transistor electrically connected to the pixel electrode.

3. The semiconductor device according to claim 1, wherein the display portion comprises a plurality of transistors each comprising an oxide semiconductor.

4. The semiconductor device according to claim 1, wherein the first substrate is a film.

5. The semiconductor device according to claim 1, wherein the chip comprises a stack of a transistor in a single crystal silicon substrate and a transistor comprising an oxide semiconductor.

6. A semiconductor device comprising:
a first substrate provided with a display portion;
at least one chip comprising a semiconductor integrated circuit;
a second substrate overlapping with the display portion; and
a touch panel portion on one surface of the second substrate,
wherein the display portion comprises a pixel,
wherein the pixel comprises a first light-emitting element, a second light-emitting element, a third light-emitting element, and an optical sensor element in matrix,
wherein each of the first light-emitting element, the second light-emitting element, and the third light-emitting element has a different emission color from each other,
wherein the touch panel portion comprises a touch sensor element,
wherein the first light-emitting element comprises a first electrode, a first common layer over the first electrode, a light-emitting layer over the first common layer, a second common layer over the light-emitting layer, and a second electrode over the second common layer, wherein the optical sensor element comprises a third electrode, the first common layer over the third electrode, an active layer over the first common layer, the second common layer over the active layer, and a fourth electrode over the second common layer, wherein the optical sensor element is configured to receive light emitted from the first light-emitting element, the second light-emitting element, and the third light-emitting element, wherein the display portion is configured to display an image and to capture an image of an object overlapping with the display portion by detection using reflected light of emitted light from the first light-emitting element, the second light-emitting element, and the third light-emitting element, wherein the chip is mounted on one surface of the first substrate, wherein the first substrate and the second substrate are fixed so that the one surface of the first substrate and the one surface of the second substrate face each other, wherein the chip comprises a detection circuit of the optical sensor element, an image processing circuit, a driver circuit of the first light-emitting element, the second light-emitting element, and the third light-emitting element, and a driver circuit of the touch sensor element, wherein the detection circuit of the optical sensor element is configured to detect a near touch, and wherein the detection circuit of the optical sensor element is further configured to output an output signal from the optical sensor element to the image processing circuit by converting an analog signal output from the optical sensor element into a digital signal.

7. The semiconductor device according to claim 6, wherein the touch panel portion is a capacitive touch panel.

8. The semiconductor device according to claim 6, wherein the chip further comprises a driver circuit of the optical sensor element.

9. A semiconductor device comprising:
a first substrate provided with a display portion;
at least one chip comprising a semiconductor integrated circuit; a second substrate overlapping with the display portion; and
a touch panel portion on one surface of the second substrate,
wherein the display portion comprises a pixel,
wherein the pixel comprises a first light-emitting element, a second light-emitting element, a third light-emitting element, and an optical sensor element in matrix,
wherein each of the first light-emitting element, the second light-emitting element, and the third light-emitting element has a different emission color from each other,
wherein the first light-emitting element comprises a first electrode, a first common layer over the first electrode, a light-emitting layer over the first common layer, a second common layer over the light-emitting layer, and a second electrode over the light emitting second common layer,
wherein the optical sensor element comprises a third electrode, the first common layer over the third electrode, an active layer over the first common layer, the second common layer over the active layer, and a fourth electrode over the second common layer,
wherein the touch panel portion comprises a touch sensor element,
wherein the optical sensor element is configured to receive light emitted from the first light-emitting element, the second light-emitting element, and the third light-emitting element,
wherein the display portion is configured to display an image and to capture an image of an object overlapping with the display portion by detection using reflected light of emitted light from the first light-emitting element, the second light-emitting element, and the third light-emitting element,
wherein the chip is mounted on one surface of the first substrate,
wherein the first substrate and the second substrate are fixed so that the one surface of the first substrate and the one surface of the second substrate face each other,
wherein the chip comprises a detection circuit of the optical sensor element, an image processing circuit, a driver circuit of the optical sensor element, and a driver circuit of the touch sensor element,
wherein the detection circuit of the optical sensor element is configured to detect a near touch, and
wherein the detection circuit of the optical sensor element is further configured to output an output signal from the optical sensor element to the image processing circuit by converting an analog signal output from the optical sensor element into a digital signal.

10. The semiconductor device according to claim 9, wherein the touch panel portion is a capacitive touch panel.

11. A semiconductor device comprising:
a first substrate provided with a display portion and a terminal portion;
a film comprising a wiring that is electrically connected to the terminal portion;
at least one chip comprising a semiconductor integrated circuit mounted on the film; and
a second substrate overlapping with the display portion,
wherein the display portion comprises a pixel,
wherein the pixel comprises a first light-emitting element, a second light-emitting element, a third light-emitting element, and an optical sensor element in matrix,
wherein each of the first light-emitting element, the second light-emitting element, and the third light-emitting element has a different emission color from each other,
wherein the first light-emitting element comprises a first electrode, a common layer over the first electrode, a light-emitting layer over the common layer, and a second electrode over the light-emitting layer,
wherein the optical sensor element comprises a third electrode, the common layer over the third electrode, an active layer over the common layer, and a fourth electrode over the active layer,
wherein the optical sensor element is configured to receive light emitted from the first light-emitting element, the second light-emitting element, and the third light-emitting element,
wherein the display portion is configured to display an image and to capture an image of an object overlapping with the display portion by detection using reflected light of emitted light from the first light-emitting element, the second light-emitting element, and the third light-emitting element,
wherein the first substrate and the second substrate are fixed so that one surface of the first substrate and one surface of the second substrate face each other, and wherein the chip including the semiconductor integrated circuit comprises a detection circuit of the optical sensor element, an image processing circuit, a driver circuit of the optical sensor element, and a driver circuit of the first light-emitting element, the second light-emitting element, and the third light-emitting element, wherein the detection circuit of the optical sensor element is configured to detect a near touch, and wherein the detection circuit of the optical sensor element is configured to output an output signal from the optical sensor element to the image processing circuit by converting an analog signal output from the optical sensor element into a digital signal.

12. The semiconductor device according to claim 11, wherein the display portion comprises a plurality of transistors each comprising an oxide semiconductor.

13. The semiconductor device according to claim 11, wherein the chip comprises a stack of a transistor in a single crystal silicon substrate and a transistor comprising an oxide semiconductor.

14. A semiconductor device comprising:
   a first substrate provided with a display portion and a terminal portion;
   a film comprising a wiring that is electrically connected to the terminal portion;
   at least one chip comprising a semiconductor integrated circuit mounted on the film;
   a second substrate overlapping with the display portion; and
   a touch panel portion on one surface of the second substrate,
   wherein the display portion comprises a pixel,
   wherein the pixel comprises a first light-emitting element, a second light-emitting element, a third light-emitting element, and an optical sensor element in matrix,
   wherein each of the first light-emitting element, the second light-emitting element, and the third light-emitting element has a different emission color from each other,
   wherein the first light-emitting element comprises a first electrode, a common layer over the first electrode, a light-emitting layer over the common layer, and a second electrode over the light-emitting layer,
   wherein the optical sensor element comprises a third electrode, the common layer over the third electrode, an active layer over the common layer, and a fourth electrode over the active layer,
   wherein the touch panel portion comprises a touch sensor element,
   wherein the optical sensor element is configured to receive light emitted from the first light-emitting element, the second light-emitting element, and the third light-emitting element,
   wherein the display portion is configured to display an image and to capture an image of an object overlapping with the display portion by detection using reflected light of emitted light from the first light-emitting element, the second light-emitting element, and the third light-emitting element,
   wherein the first substrate and the second substrate are fixed so that one surface of the first substrate and the one surface of the second substrate face each other,
   wherein the chip including the semiconductor integrated circuit comprises a detection circuit of the optical sensor element, an image processing circuit, a driver circuit of the first light-emitting element, the second light-emitting element, and the third light-emitting element, and a driver circuit of the touch sensor element,
   wherein the detection circuit of the optical sensor element is configured to detect a near touch, and
   wherein the detection circuit of the optical sensor element is configured to output an output signal from the optical sensor element to the image processing circuit by converting an analog signal output from the optical sensor element into a digital signal.

15. The semiconductor device according to claim 14, wherein the touch panel portion is a capacitive touch panel.

16. The semiconductor device according to claim 14, wherein the chip further comprises a driver circuit of the optical sensor element.

17. A semiconductor device comprising:
   a first substrate provided with a display portion and a terminal portion;
   a film comprising a wiring that is electrically connected to the terminal portion;
   at least one chip comprising a semiconductor integrated circuit mounted on the film;
   a second substrate overlapping with the display portion; and
   a touch panel portion on one surface of the second substrate,
   wherein the display portion comprises a pixel,
   wherein the pixel comprises a first light-emitting element, a second light-emitting element, a third light-emitting element, and an optical sensor element in matrix,
   wherein each of the first light-emitting element, the second light-emitting element, and the third light-emitting element has a different emission color from each other,
   wherein the first light-emitting element comprises a first electrode, a common layer over the first electrode, a light-emitting layer over the common layer, and a second electrode over the light-emitting layer,
   wherein the optical sensor element comprises a third electrode, the common layer over the third electrode, an active layer over the common layer, and a fourth electrode over the active layer,
   wherein the touch panel portion comprises a touch sensor element,
   wherein the optical sensor element is configured to receive light emitted from the first light-emitting element, the second light-emitting element, and the third light-emitting element,
   wherein the display portion is configured to display an image and to capture an image of an object overlapping with the display portion by detection using reflected light of emitted light from the first light-emitting element, the second light-emitting element, and the third light-emitting element,
   wherein the first substrate and the second substrate are fixed so that one surface of the first substrate and the one surface of the second substrate face each other,
   wherein the chip including the semiconductor integrated circuit comprises a detection circuit of the optical sensor element, an image processing circuit, a driver circuit of the optical sensor element, and a driver circuit of the touch sensor element,
   wherein the detection circuit of the optical sensor element is configured to detect a near touch, and
   wherein the detection circuit of the optical sensor element is configured to output an output signal from the optical sensor element to the image processing circuit by converting an analog signal output from the optical sensor element into a digital signal.

18. The semiconductor device according to claim 17, wherein the touch panel portion is a capacitive touch panel.

\* \* \* \* \*